US012563750B2

(12) United States Patent
Nagashima

(10) Patent No.: US 12,563,750 B2
(45) Date of Patent: Feb. 24, 2026

(54) SEMICONDUCTOR MEMORY DEVICE AND METHOD OF MANUFACTURING THE SAME

(71) Applicant: Kioxia Corporation, Tokyo (JP)

(72) Inventor: Yoshiki Nagashima, Kita (JP)

(73) Assignee: Kioxia Corporation, Tokyo (JP)

( * ) Notice: Subject to any disclaimer, the term of this patent is extended or adjusted under 35 U.S.C. 154(b) by 317 days.

(21) Appl. No.: 18/181,148

(22) Filed: Mar. 9, 2023

(65) Prior Publication Data

US 2024/0099029 A1 Mar. 21, 2024

(30) Foreign Application Priority Data

Sep. 20, 2022 (JP) ................................. 2022-149626

(51) Int. Cl.
*H10B 80/00* (2023.01)
(52) U.S. Cl.
CPC .................................. *H10B 80/00* (2023.02)
(58) Field of Classification Search
CPC ..... H10B 80/00; H01L 25/18; H01L 25/0657; H01L 25/16; H01L 2225/06506; H01L 2225/0651; H01L 2225/06562; G11C 2029/4402; G11C 2029/5006; G11C 29/50
USPC .................................................... 365/185.18
See application file for complete search history.

(56) References Cited

U.S. PATENT DOCUMENTS

| | | | |
|---|---|---|---|
| 7,683,491 B2 | 3/2010 | Itoh et al. | |
| 9,425,177 B2 | 8/2016 | Koyanagi et al. | |
| 10,692,583 B2 | 6/2020 | Shin | |
| 10,811,108 B2 | 10/2020 | Sano et al. | |
| 11,145,625 B2 | 10/2021 | Koyanagi | |
| 2023/0048317 A1* | 2/2023 | Veches | G11C 5/14 |
| 2023/0260949 A1* | 8/2023 | Chen | H01L 24/83 |
| | | | 257/618 |

FOREIGN PATENT DOCUMENTS

JP 2020-91930 A 6/2020

* cited by examiner

*Primary Examiner* — Fernando Hidalgo
(74) *Attorney, Agent, or Firm* — Oblon, McClelland, Maier & Neustadt, L.L.P.

(57) ABSTRACT

A semiconductor memory device includes a first memory die, a second memory die disposed above the first memory die via adhesives, a first wiring connected to the first memory die, and configured to apply a power supply voltage to the first memory die, a first switch element connected to the first wiring, a second wiring connected to the second memory die, and configured to apply the power supply voltage to the second memory die, a second switch element connected to the second wiring, and a third wiring configured to electrically connect to the first wiring via the first switch element, and configured to electrically connect to the second wiring via the second switch element. The first switch element and the second switch element are independently controllable.

15 Claims, 17 Drawing Sheets

SEMICONDUCTOR MEMORY DEVICE AND METHOD OF MANUFACTURING THE SAME

CROSS-REFERENCE TO RELATED APPLICATIONS

This application is based upon and claims the benefit of Japanese Patent Application No. 2022-149626, filed on Sep. 20, 2022, the entire contents of which are incorporated herein by reference.

BACKGROUND

Field

Embodiments described herein relate generally to a semiconductor memory device and a method of manufacturing the same.

Description of the Related Art

There has been known a semiconductor memory device including a mounting substrate, a plurality of memory dies stacked in a stacking direction on the mounting substrate, and voltage supply lines such as bonding wires electrically connected to these plurality of memory dies and configured to apply a power supply voltage to these plurality of memory dies.

DETAILED DESCRIPTION

Figure 1:
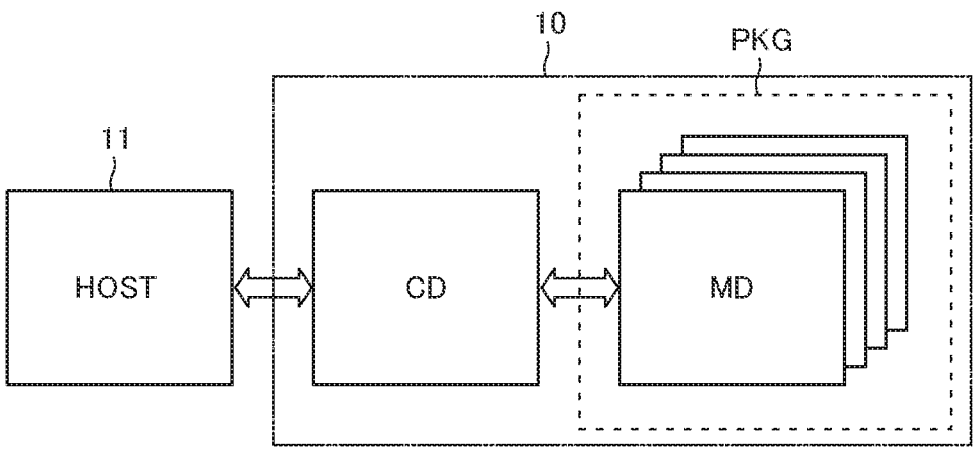
FIG. 1 is a schematic block diagram illustrating a configuration of a memory system 10 according to a first embodiment.

A semiconductor memory device according to one embodiment comprises a first memory die, a second memory die disposed above the first memory die via adhesives, a first wiring connected to the first memory die, and configured to apply a power supply voltage to the first memory die, a first switch element connected to the first wiring, a second wiring connected to the second memory die, and configured to apply the power supply voltage to the second memory die, a second switch element connected to the second wiring, and a third wiring configured to electrically connect to the first wiring via the first switch element, and configured to electrically connect to the second wiring via the second switch element. The first switch element and the second switch element are independently controllable.

Next, the semiconductor memory devices according to embodiments are described in detail with reference to the drawings. The following embodiments are only examples, and not described for the purpose of limiting the present invention. The following drawings are schematic, and for convenience of description, a part of a configuration and the like is sometimes omitted. Parts common in a plurality of embodiments are attached by same reference numerals and their descriptions may be omitted.

In this specification, when referring to a "semiconductor memory device", it may mean a memory package including a memory die. The memory package may include a controller die, or need not include a controller die. The "semiconductor memory device" may also mean a configuration including a memory package, such as a Solid State Drive (SSD), and a controller die disposed outside the memory package. Further, it may mean a configuration including a host computer, such as a smartphone, a tablet terminal, and a personal computer.

In this specification, when it is referred that a first configuration "is electrically connected" to a second configuration, the first configuration may be directly connected to the second configuration, and the first configuration may be connected to the second configuration via a wiring, a semiconductor member, a switch element, or the like. For example, when three switch elements are connected in series, even when the second switch element is in OFF state, the first switch element is "electrically connected" to the third switch element.

In this specification, when it is referred that the first configuration "is connected between" the second configuration and a third configuration, it may mean that the first configuration, the second configuration, and the third configuration are connected in series and the second configuration is connected to the third configuration via the first configuration.

In this specification, when it is referred that a circuit or the like "electrically conducts" two wirings or the like, it may mean, for example, that this circuit or the like includes a switch element or the like, this switch element or the like is disposed in a current path between the two wirings, and this switch element or the like is turned ON.

In this specification, when it is referred that a circuit or the like "electrically separates" two wirings or the like, it may mean, for example, that this circuit or the like includes a switch element or the like, this switch element or the like is disposed in a current path between the two wirings, and this switch element or the like is turned OFF.

In this specification, a direction parallel to an upper surface of the substrate is referred to as an X-direction, a direction parallel to the upper surface of the substrate and perpendicular to the X-direction is referred to as a Y-direction, and a direction perpendicular to the upper surface of the substrate is referred to as a Z-direction.

In this specification, a direction intersecting with a surface of the substrate is referred to as a stacking direction in some cases. A direction along a predetermined plane intersecting with the stacking direction is referred to as a first direction, and a direction intersecting with the first direction along this surface is sometimes referred to as a second direction. The stacking direction may correspond to the Z-direction, and need not correspond to the Z-direction. The first direction and the second direction may correspond to any of the X-direction and the Y-direction, and need not correspond to the X-direction or the Y-direction.

Expressions such as "above" and "below" in this specification are based on the substrate. For example, a direction away from the substrate along the Z-direction is referred to as above and a direction approaching the substrate along the Z-direction is referred to as below. A lower surface and a lower end of a certain configuration mean a surface and an end portion at the substrate side of this configuration. An upper surface and an upper end of a certain configuration mean a surface and an end portion at a side opposite to the substrate of this configuration. A surface intersecting with the X-direction or the Y-direction is referred to as a side surface and the like.

In this specification, a part of signals are indicated as high active signals (positive logic signals) or low active signals (negative logic signals). The first character of the name of the low active signal is a slash ("/"). In this specification, which of the signals are to be the high active signals and which signals are to be the low active signals are indicated as examples, and specific aspects are appropriately adjustable. For example, a part of or all of the high active signals can be the low active signals, or a part of or all of the low active signals can be the high active signals.

First Embodiment

[Overall Configuration]

FIG. 1 is a schematic block diagram illustrating a configuration of a memory system 10 according to a first embodiment.

The memory system 10 executes, for example, a read operation, a write operation, an erase operation, and the like of user data in response to a signal transmitted from a host computer 11. The memory system 10 is, for example, any system that can store the user data including a memory card and an SSD. The memory system 10 includes at least one memory package PKG and a controller die CD.

The memory package PKG includes a plurality of memory dies MD. The memory die MD stores the user data.

The controller die CD is connected to the plurality of memory dies MD and the host computer 11. The controller die CD includes, for example, a processor and a RAM. The controller die CD performs conversion between a logical address and a physical address, bit error detection/correction, a garbage collection (compaction), a wear leveling, and the like. Functions of respective portions of the controller die CD can be achieved by any of dedicated hardware, a processor that executes a program, or a combination of these.

Figure 2:
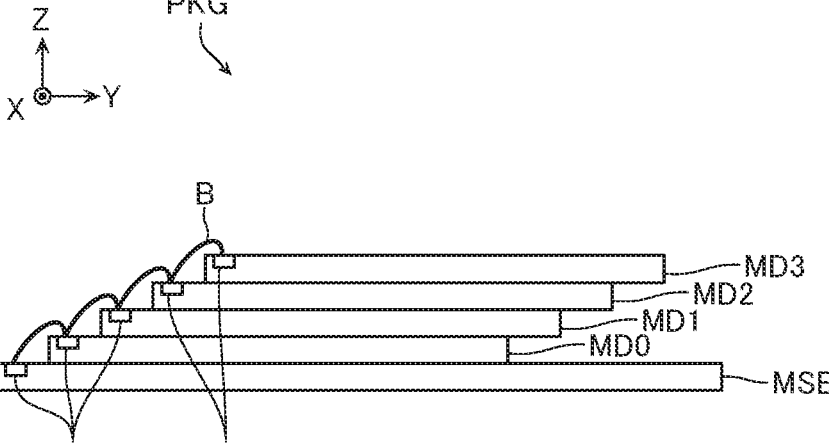
FIG. 2 is a schematic side view illustrating an exemplary configuration of a memory package PKG according to the first embodiment.
Figure 3:
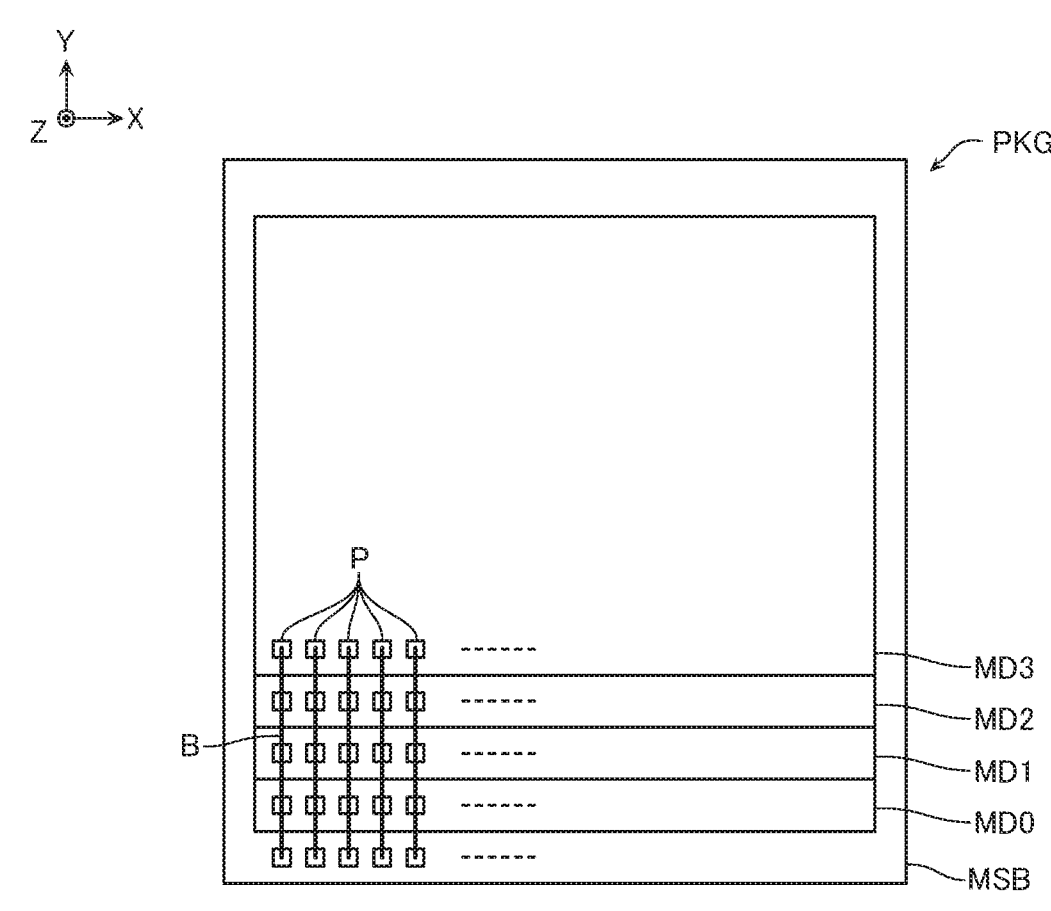
FIG. 3 is a schematic plan view illustrating the exemplary configuration.

FIG. 2 is a schematic side view illustrating an exemplary configuration of the memory package PKG according to the embodiment. FIG. 3 is a schematic plan view illustrating the exemplary configuration. For convenience of description, FIG. 2 and FIG. 3 omit parts of the configuration. For example, in FIG. 2 and FIG. 3, for convenience of description, bonding pad electrodes P used for applying power supply voltages and the like are omitted.

As illustrated in FIG. 2, the memory package PKG according to the embodiment includes a mounting substrate (substrate) MSB and four memory dies MD stacked in a Z-direction on the mounting substrate MSB. Note that, in the illustrated example, memory dies MD0 to MD3 are exemplified as the four memory dies MD. The bonding pad electrodes P are disposed in a region of an end portion in a Y-direction negative side of an upper surface of the mounting substrate MSB. A region overlapping with the memory die MD0 when viewed from the Z-direction of the upper surface of the mounting substrate MSB is bonded to a lower surface of the memory die MD0 via an adhesive or the like. The bonding pad electrodes P are disposed in regions of end portions in the Y-direction negative side of the upper surfaces of the memory dies MD0 to MD3. Regions other than the end portions in the Y-direction negative side of the upper surfaces of the memory dies MD0 to MD2 are bonded to respective lower surfaces of the other memory dies MD1 to MD3 via adhesives or the like.

As illustrated in FIG. 3, the mounting substrate MSB, and the four memory dies MD0 to MD3 each include the plurality of bonding pad electrodes P arranged in the X-direction. The plurality of bonding pad electrodes P disposed on the mounting substrate MSB and the four memory dies MD0 to MD3 are each connected to a bonding wire B.

In the illustrated example, four bonding pad electrodes P corresponding to a common signal line and the like between the four memory dies MD0 to MD3 and one bonding pad electrode P on the mounting substrate MSB corresponding to the four bonding pad electrodes P are arranged in the Y-direction when viewed from the Z-direction. A bonding wire B corresponding to the one bonding pad electrode P is connected in common between these five bonding pad electrodes P. These bonding wires B extend in the Y-direction when viewed from the Z-direction.

Note that the configuration of the memory package PKG illustrated in FIG. 2 and FIG. 3 are merely examples, and specific configurations are appropriately adjustable. For example, the number of the memory dies MD stacked on the mounting substrate MSB may be more than or less than four. The memory package PKG may include a controller die CD (FIG. 1). In such a case, the controller die CD may be stacked on an upper surface of a memory die MD disposed uppermost. Additionally, the plurality of memory dies MD and the controller die CD may be connected to one another via through electrodes or the like, instead of the bonding wires B.

[Standby Current of Memory Die MD]

The power supply voltage is applied to the four memory dies MD0 to MD3 via a part of the plurality of bonding pad electrodes P. Accordingly, it can be considered, for example, to connect a bonding wire B in common between four bonding pad electrodes P corresponding to these four memory dies MD0 to MD3 and apply the power supply voltage via this bonding wire B.

Here, a manufacturing process of the memory package PKG includes a test performed before shipping the memory package PKG. In this test, a standby current flowing through the power supply wiring of the memory package PKG is measured. In this respect, if a standby current of a size exceeding a threshold current is detected, for example, even in a case where a standby current in one memory die MD is large and standby currents in the remaining three memory dies MD are small, the whole memory package PKG is determined not to be shippable.

In addition, in such configuration, even by measuring the standby current flowing through the power supply wiring, it is difficult to measure approximately how large a standby currents of which memory die MD is, and thus takes time to perform a failure analysis in some cases.

In addition, in such configuration, it is difficult to stop applying the power supply voltage in units of the memory dies MD, and thus power consumption during a standby state relatively increases in some cases.

Therefore, the semiconductor memory device according to the first embodiment employs a configuration in which the power supply voltage can be applied separately to the four memory dies MD0 to MD3 included in the memory package PKG. Hereinafter, this point is described.

[Supply Path of Power Supply Voltage]

Figure 4:
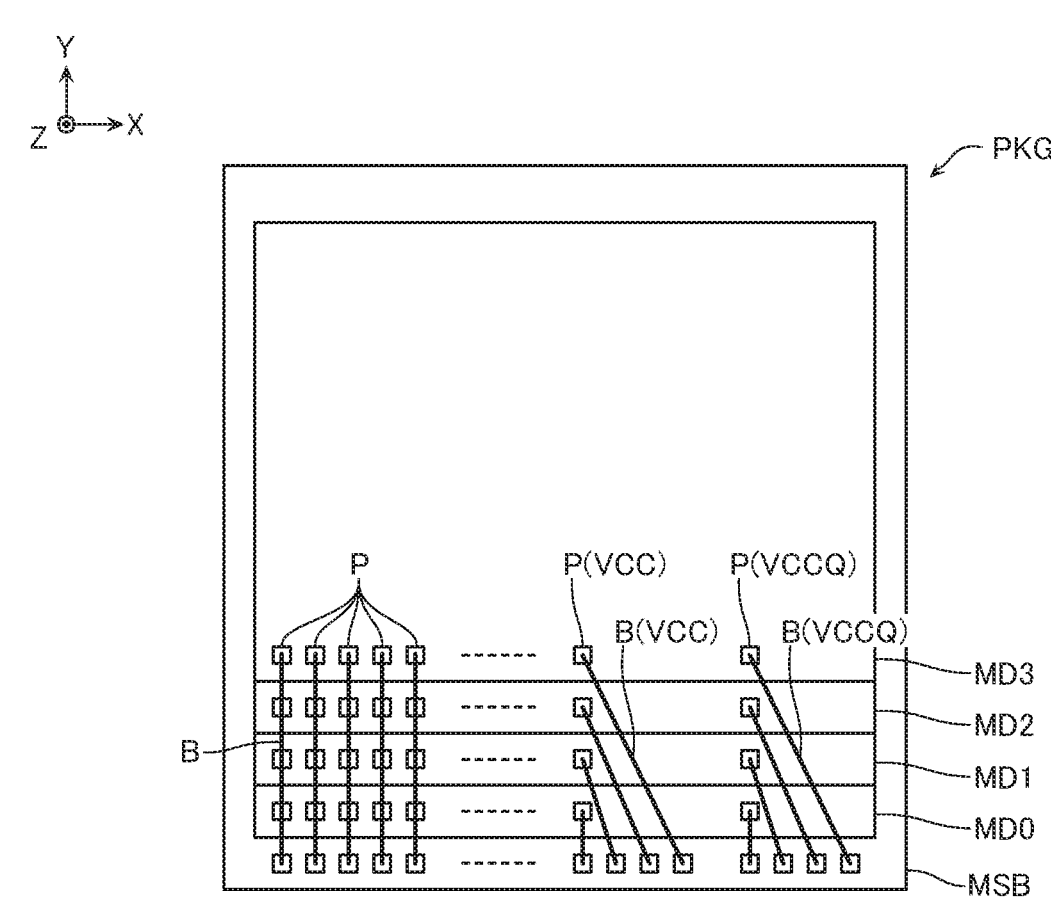
FIG. 4 is a schematic plan view illustrating the exemplary configuration.

FIG. 4 is a schematic plan view illustrating an exemplary configuration of the memory package PKG according to the embodiment. For convenience of description, FIG. 4 omits a part of the configuration. However, FIG. 4 illustrates bonding pad electrodes P (P(VCC), P(VCCQ)) used for applying the power supply voltage and the like, which have been omitted in FIG. 3.

Note that, FIG. 4 illustrates bonding pad electrodes P that are used for applying a power supply voltage VCC to the memory dies MD0 to MD3 as the bonding pad electrodes P(VCC) among the plurality of bonding pad electrodes P. In addition, FIG. 4 illustrates bonding pad electrodes P that are used for applying a power supply voltage VCCQ to the memory dies MD0 to MD3 as the bonding pad electrodes P(VCCQ) among the plurality of bonding pad electrodes P. Note that, while the power supply voltages VCC, VCCQ are exemplified in the following description, a power supply voltage other than the power supply voltages VCC, VCCQ may be applied to the memory dies MD0 to MD3.

Furthermore, FIG. 4 illustrates bonding wires B used for applying a power supply voltage VCC to the memory dies MD0 to MD3 (bonding wires B that function as voltage supply lines) as bonding wires B(VCC) among the plurality of bonding wires B. In addition, FIG. 4 illustrates bonding wires B used for applying a power supply voltage VCCQ to the memory dies MD0 to MD3 (bonding wires B that function as voltage supply lines) as bonding wires B(VCCQ) among the plurality of bonding wires B.

In the illustrated example, the bonding pad electrodes P(VCC) of the four memory dies MD0 to MD3 are arranged in the Y-direction when viewed from the Z-direction. In addition, four bonding pad electrodes P(VCC) disposed in the Y-direction negative side with respect to the memory dies MD0 to MD3 and arranged in the X-direction when viewed from the Z-direction are disposed on the mounting substrate MSB. In the illustrated example, corresponding to the four bonding pad electrodes P(VCC), four bonding wires B(VCC) are also disposed. The respective bonding wires B(VCC) are connected to two bonding pad electrodes P in total, which include one bonding pad electrode P(VCC) disposed on the mounting substrate MSB and one bonding pad electrode P(VCC) disposed on one of the four memory dies MD0 to MD3, and are not connected to the remain three memory dies MD. In the illustrated example, one of the four bonding wires B(VCC) extends in the Y-direction when viewed from the Z-direction. Three of the four bonding wires B(VCC) extend in diagonal directions (directions intersecting with the X-direction and the Y-direction when viewed from the Z-direction) when viewed from the Z-direction. The extending directions of these four bonding wires B(VCC) when viewed from the Z-direction are all different.

In the illustrated example, the bonding pad electrodes P(VCCQ) of the four memory dies MD0 to MD3 are arranged in the Y-direction when viewed from the Z-direction. Four bonding pad electrodes P(VCCQ) disposed in the Y-direction negative side with respect to the memory dies MD0 to MD3 and arranged in the X-direction when viewed from the Z-direction are disposed on the mounting substrate MSB. In the illustrated example, corresponding to the four bonding pad electrodes P(VCCQ), four bonding wires B(VCCQ) are also disposed. The respective bonding wires B(VCCQ) are connected to two bonding pad electrodes P in total including one bonding pad electrode P(VCCQ) disposed on the mounting substrate MSB and one bonding pad electrode P(VCCQ) disposed on one of the four memory dies MD0 to MD3, and are not connected to the remaining three memory dies MD. In the illustrated example, one of the four bonding wires B(VCCQ) extends in the Y-direction when viewed from the Z-direction. Three of the four bonding wires B(VCCQ) extend in diagonal directions when viewed from the Z-direction. The extending directions of these four bonding wires B(VCCQ) when viewed from the Z-direction are all different.

Figure 5:
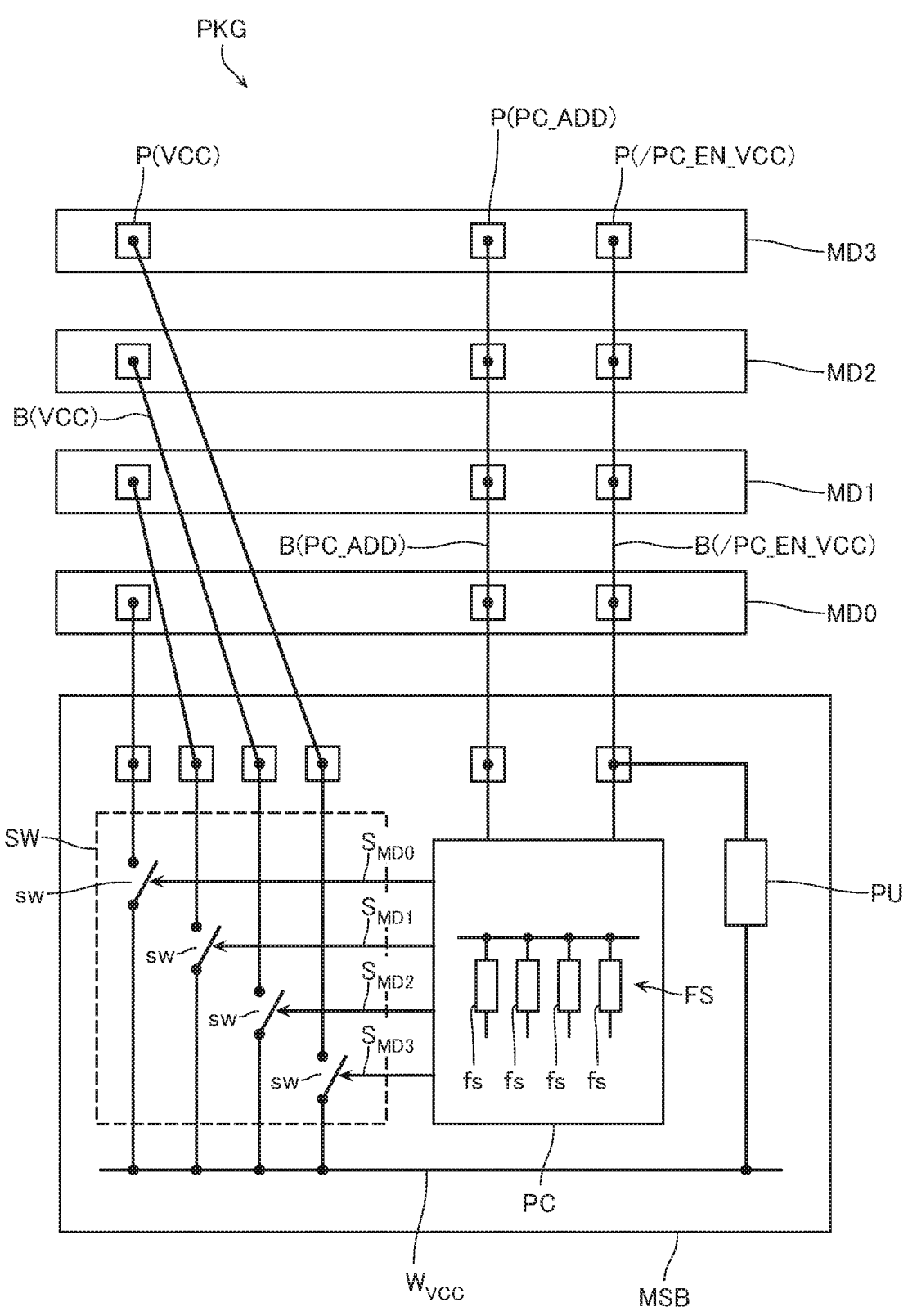
FIG. 5 is a schematic block diagram illustrating a part of the configuration of the memory package PKG.

FIG. 5 is a schematic block diagram illustrating a part of the configuration of the memory package PKG according to the embodiment.

As illustrated in FIG. 5, the mounting substrate MSB includes a switch circuit SW electrically connected to the bonding pad electrodes P(VCC), a power supply wiring $W_{VCC}$ connected to the switch circuit SW, and a switch control circuit PC that controls the switch circuit SW.

The switch circuit SW includes four switch elements sw disposed corresponding to the four memory dies MD0 to MD3. These four switch elements sw are configured to be controllable independently from one another. The switch elements sw each include a terminal electrically connected to the bonding pad electrode P(VCC) and a terminal electrically connected to the power supply wiring $W_{VCC}$, and these two terminals are electrically conducted or these two terminals are electrically separated in response to control signals $S_{MD0}$ to $S_{MD3}$. For example, when the control signal $S_{MD0}$ is in an "H" state, the switch element sw corresponding to the memory die MD0 is in the ON state. Accordingly, the bonding pad electrode P(VCC) disposed on the memory die MD0 electrically conducts with the power supply wiring $W_{VCC}$. When the control signal $S_{MD0}$ is in an "L" state, the switch element sw corresponding to the memory die MD0 is in the OFF state. Accordingly, the bonding pad electrode P(VCC) disposed on the memory die MD0 is electrically separated from the power supply wiring $W_{VCC}$.

The power supply wiring $W_{VCC}$ is used for applying the power supply voltage VCC to the memory dies MD0 to MD3. For example, when the memory die MD0 electrically conducts with the power supply wiring $W_{VCC}$, the power supply voltage VCC is applied to the memory die MD0. On the other hand, when the memory die MD0 is electrically separated from the power supply wiring $W_{VCC}$, the power supply voltage VCC is not applied to the memory die MD0.

The switch control circuit PC outputs control signals $S_{MD0}$ to $S_{MD3}$ to the switch circuit SW. The switch control circuit PC controls the control signals $S_{MD0}$ to $S_{MD3}$ to be in the "H" state or the "L" state according to an operation from outside and the like.

The switch control circuit PC is connected in common to bonding pad electrodes P (PC_ADD) of the memory dies MD0 to MD3 via the bonding wire B(PC_ADD). The bonding pad electrode P(PC_ADD) is one of the plurality of bonding pad electrodes P and functions as a signal supply line used for transferring an address signal PC_ADD described later. The bonding wire B(PC_ADD) is connected in common to a plurality of bonding pad electrodes P(PC_ADD).

Furthermore, the switch control circuit PC is connected in common to bonding pad electrodes P(/PC_EN_VCC) of the memory dies MD0 to MD3 via the bonding wire B(/PC_EN_VCC). The bonding pad electrode P(/PC_EN_VCC) is one of the plurality of bonding pad electrodes P and functions as a signal supply line used for transferring an enable signal/PC_EN_VCC described later. The bonding wire B(/PC_EN_VCC) is connected in common to a plurality of the bonding pad electrodes P(/PC_EN_VCC).

A pull-up circuit PU is connected between the bonding wire B(/PC_EN_VCC) and the power supply wiring $W_{VCC}$. The pull-up circuit PU applies the power supply voltage VCC to the bonding wire B(/PC_EN_VCC) as necessary. The pull-up circuit PU restrains the enable signal/PC_EN_VCC described later entering the "L" state at inappropriate timing and thereby causing a malfunction.

The switch control circuit PC may include a fuse circuit FS. The illustrated fuse circuit FS includes four fuse elements fs corresponding to the four memory dies MD0 to MD3. These four fuse elements fs are used for invalidating the memory dies MD. The invalidated memory die MD is set to become a state electrically separated from the power supply wiring $W_{VCC}$ in a use state of the semiconductor memory device. For example, when the fuse element fs corresponding to the memory die MD0 is cut off, the control signal $S_{MD0}$ is maintained in the "L" state.

Note that FIG. 5 has exemplified the switch circuit SW corresponding to the power supply voltage VCC. However, a configuration similar to the switch circuit SW may be disposed corresponding to the power supply voltage VCCQ or another power supply voltage. In this case, one switch control circuit PC corresponding to the power supply voltage VCC, VCCQ or another power supply voltage may be disposed on the mounting substrate MSB, and thereby control a plurality of the switch circuits SW corresponding to the power supply voltage VCC, VCCQ or another power supply voltage. A plurality of the switch control circuits PC corresponding to the power supply voltage VCC, VCCQ, or another power supply voltage may be disposed on the mounting substrate MSB.

When disposing a plurality of switch circuits SW corresponding to the power supply voltages VCC, VCCQ and the like, the control signals $S_{MD0}$ to $S_{MD3}$ output from the switch control circuit PC may be controlled independently for each of the power supply voltages VCC, VCCQ and the like, or may be controlled in common. In the former case, for example, it is possible for the switch element sw corresponding to the power supply voltage VCC of the memory die MD0 to be in the ON state, while the switch element sw corresponding to the power supply voltage VCCQ of the memory die MD0 is in the OFF state. In addition, the control signals $S_{MD0}$ to $S_{MD3}$ can be allowed to shift between a mode in which the control signals are controlled independently for each of the power supply voltages VCC, VCCQ and the like, and a mode in which the control signals are controlled in common.

While illustration is omitted, a plurality of the bonding pad electrodes P and the bonding wires B corresponding to the same power supply voltage may be disposed on the memory dies MD. In this case, one switch control circuit PC may be disposed on the mounting substrate MSB and thereby control a plurality of the switch circuits SW corresponding to the plurality of bonding wires B. Furthermore, a plurality of the switch control circuits PC may be disposed on the mounting substrate MSB corresponding to the plurality of bonding wires B corresponding to the same power supply voltage.

When the plurality of switch circuits SW corresponding to the plurality of bonding wires B are disposed, the control signals $S_{MD0}$ to $S_{MD3}$ output from the switch control circuit PC may be controlled independently for each of the bonding wires B, or may be controlled in common. In addition, the control signals $S_{MD0}$ to $S_{MD3}$ can be allowed to shift between a mode in which the control signals are controlled independently for each of the bonding wires B and the like, and a mode in which the control signals are controlled in common.

In the example of FIG. 5, the pull-up circuit PU is connected to the power supply wiring $W_{VCC}$ corresponding to the power supply voltage VCC. However, the pull-up circuit PU may be connected to a power supply wiring corresponding to the power supply voltage VCCQ or another power supply voltage.

[Switch Operation]

The semiconductor memory device according to the first embodiment allows any of the memory dies MD0 to MD3 to be electrically separated from the power supply wiring $W_{VCC}$, or to be electrically conducted with the power supply wiring $W_{VCC}$ by appropriately switching the ON state/OFF state of the switch elements sw. Hereinafter, such operation is referred to as a "switch operation".

The switch operation is executed by one of the memory dies MD0 to MD3. Accordingly, the ON state/OFF state of a switch element sw corresponding to another one of the memory dies MD0 to MD3 is switched. Hereinafter, a description will be given of an example in which the switch operation is executed by the memory die MD0 and the ON state/OFF state of the memory die MD2 is switched.

Figure 6:
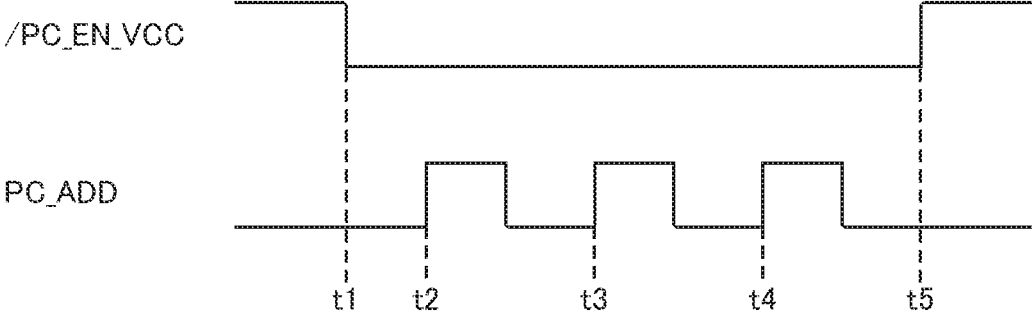
FIG. 6 is a schematic waveform diagram for describing a switch operation of the semiconductor memory device according to the first embodiment.

FIG. 6 is a schematic waveform diagram for describing the switch operation of the semiconductor memory device according to the first embodiment.

In the illustrated example, the enable signal/PC_EN_VCC is in the "H" state and the address signal PC_ADD is in the "L" state before the switch operation is executed.

At timing t1 of the switch operation, the enable signal/PC_EN_VCC enters the "L" state. Accordingly, the switch control circuit PC enters a state where the address signal PC_ADD can be input.

At each of timings t2 to t4 of the switch operation, the address signal PC_ADD is raised. Every time the address signal PC_ADD is raised, the switch control circuit PC switches the memory die MD as the switch operation target. For example, the switch operation target is switched from None (a state where none of the memory dies MD0 to MD3 are selected) to the memory die MD0 at timing t2, switched to the memory die MD1 at timing t3, and switched to the memory die MD2 at timing t4.

At timing t5 of the switch operation, the enable signal/PC_EN_VCC enters the "H" state. Accordingly, the switch control circuit PC enters a state where the address signal PC_ADD cannot be input. A signal $S_{MD2}$ (FIG. 5) corresponding to a memory die MD as the switch operation target (memory die MD2 in the illustrated example) at this timing is switched from the "H" state to the "L" state or from the "L" state to the "H" state.

Figure 7:
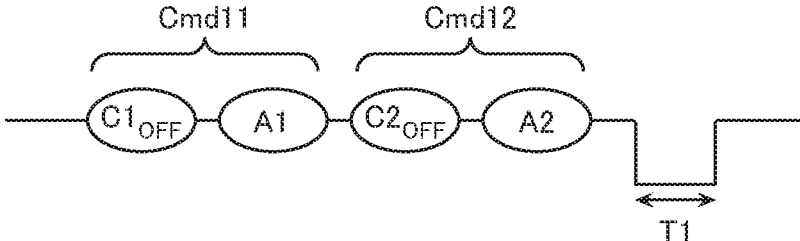
FIG. 7 is a schematic waveform diagram for describing the switch operation of the semiconductor memory device according to the first embodiment.

FIG. 7 is a schematic waveform diagram for describing the switch operation of the semiconductor memory device according to the first embodiment. A first memory die corresponding to a first address information sets to switch a connecting state between a second memory die corresponding to a second address information and a first wiring from a conducting state to a state electrically separated or from the state electrically separated to the conducting state.

When electrically separating one of the memory dies MD0 to MD3 from the power supply wiring $W_{VCC}$, the controller die CD described with reference to FIG. 1 inputs command sets Cmd11, Cmd12 as illustrated in FIG. 7 to the memory dies MD0 to MD3.

The command set Cmd11 is used for specifying the memory die MD (such as the memory die MD0) that executes the switch operation. The command set Cmd11 includes a command signal $C1_{OFF}$ and an address signal A1. The address signal A1 includes a chip address of the memory die MD (such as the memory die MD0) that executes the switch operation. The address signal A1 is only examples of the first address information. The memory die MD that performs the switch operation is only examples of the first memory die.

The command set Cmd12 is used for specifying the memory die MD (such as the memory die MD2) that is to be electrically separated from the power supply wiring $W_{VCC}$. The command set Cmd12 includes a command signal $C2_{OFF}$ and an address signal A2. The address signal A2 includes a chip address of the memory die MD (such as the memory die MD2) that is to be electrically separated from the power supply wiring $W_{VCC}$. The address signal A2 is only examples of the second address information. The memory die MD electrically separated from the power supply wiring $W_{VCC}$ is only examples of the second memory die.

After the command sets Cmd11, Cmd12 are input, the switch operation described with reference to FIG. 6 is executed in period T1.

Figure 8:
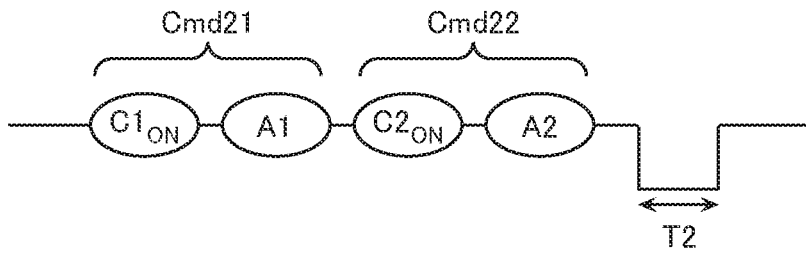
FIG. 8 is a schematic waveform diagram for describing the switch operation of the semiconductor memory device according to the first embodiment.

FIG. 8 is a schematic waveform diagram for describing the switch operation of the semiconductor memory device according to the first embodiment.

When one of the memory dies MD0 to MD3 is electrically conducted with the power supply wiring $W_{VCC}$, the controller die CD described with reference to FIG. 1 inputs command sets Cmd21, Cmd22 as illustrated in FIG. 8 to the memory dies MD0 to MD3.

The command set Cmd21 is used for specifying the memory die MD (such as the memory die MD0) that executes the switch operation. The command set Cmd21 includes a command signal $C1_{ON}$ and an address signal A1.

The command set Cmd22 is used for specifying a memory die MD (such as the memory die MD2) that is to be electrically conducted with the power supply wiring $W_{VCC}$. The command set Cmd22 includes a command signal $C2_{ON}$ and an address signal A2. The memory die MD that is to be electrically conducted with the power supply wiring $W_{VCC}$ is only examples of the second memory die.

After the command sets Cmd21, Cmd22 are input, the switch operation described with reference to FIG. 6 is executed in period T2.

[Identification of Memory Die MD Having Large Standby Current]

As described above, the manufacturing process of the memory package PKG includes a test performed before shipping the memory package PKG. The test measures the standby current flowing through the power supply wiring of the memory package PKG. In this process, if a standby current of a size exceeding the threshold current is detected, for example, by measuring the standby current flowing through the power supply wiring while operating the switch elements sw to electrically separate the four memory dies MD0 to MD3 in sequence from the power supply wiring $W_{VCC}$ or to electrically conduct the four memory dies MD0 to MD3 in sequence to the power supply wiring $W_{VCC}$, it is possible to measure approximately how large a standby current of which memory die MD is. Hereinafter, such method will be described.

Figure 9:
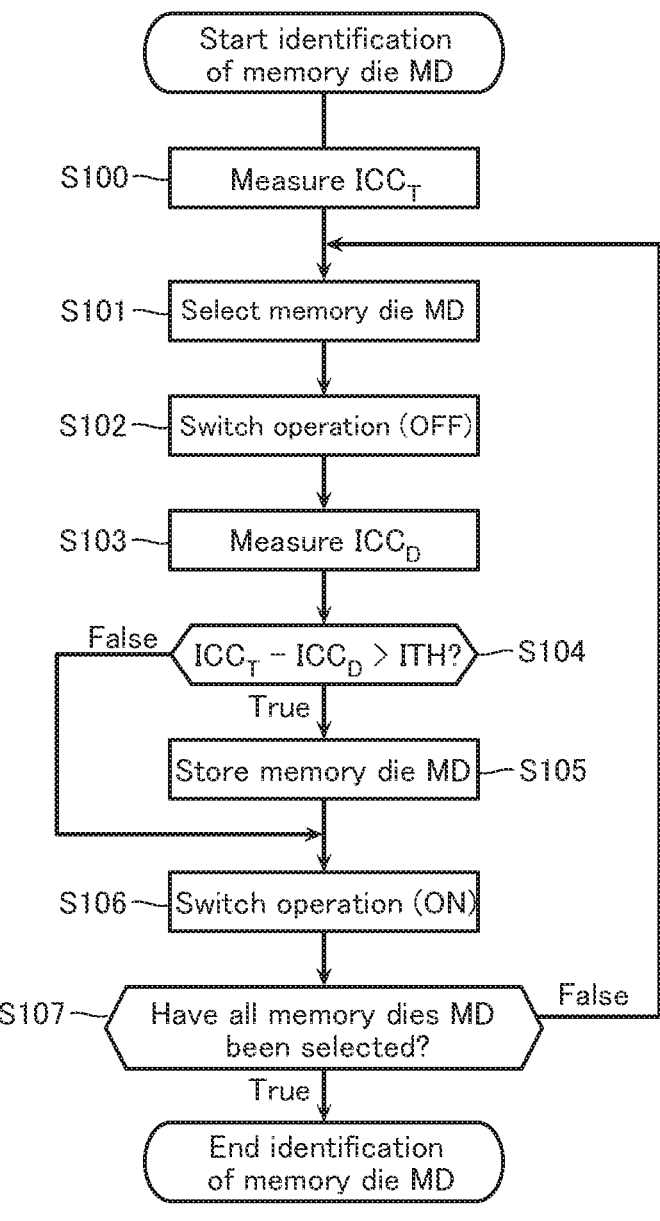
FIG. 9 is a schematic flowchart for describing an identification method of a memory die MD having a large standby current.

FIG. 9 is a schematic flowchart for describing the identification method of a memory die MD having a large standby current. In the method exemplified in FIG. 9, the four memory dies MD0 to MD3 are electrically separated in sequence from the power supply wiring $W_{VCC}$ and a decreased amount of a current ICC flowing through the power supply wiring $W_{VCC}$ is monitored to identify the memory die MD having a large standby current.

Note that, in the following description, an example of the current ICC corresponding to the power supply voltage VCC will be described. However, a similar method can be employed to a current corresponding to the power supply voltage VCCQ.

In step S100, a current $ICC_T$ is measured. The current $ICC_T$ is a standby current flowing through the power supply wiring $W_{VCC}$ when the four memory dies MD0 to MD3 are all electrically conducted with the power supply wiring $W_{VCC}$.

In step S101, any one of the memory dies MD0 to MD3 is selected.

In step S102, the switch operation described with reference to FIG. 6 and FIG. 7 is executed, and the memory die MD selected in step S101 is electrically separated from the power supply wiring $W_{VCC}$.

In step S103, a current $ICC_D$ is measured. The current $ICC_D$ is a standby current flowing through the power supply wiring $W_{VCC}$ when one of the four memory dies MD0 to MD3 is in the OFF state and the remaining three are in the ON state.

In step S104, it is determined whether a size obtained by subtracting the current $ICC_D$ from the current $ICC_T$ is larger than a threshold current ITH or not. When it is larger, the process proceeds to step S105. When it is not larger, the process proceeds to step S106.

In step S105, information identifying the memory die MD selected in step S101 is stored, and the process proceeds to step S106.

In step S106, the switch operation described with reference to FIG. 6 and FIG. 8 is executed to electrically conduct the memory die MD selected in step S101 with the power supply wiring $W_{VCC}$.

In step S107, it is determined whether the four memory dies MD0 to MD3 are all selected or not. When they are all selected, the process is terminated. When not all of them are selected, the process returns to step S101.

Figure 10:
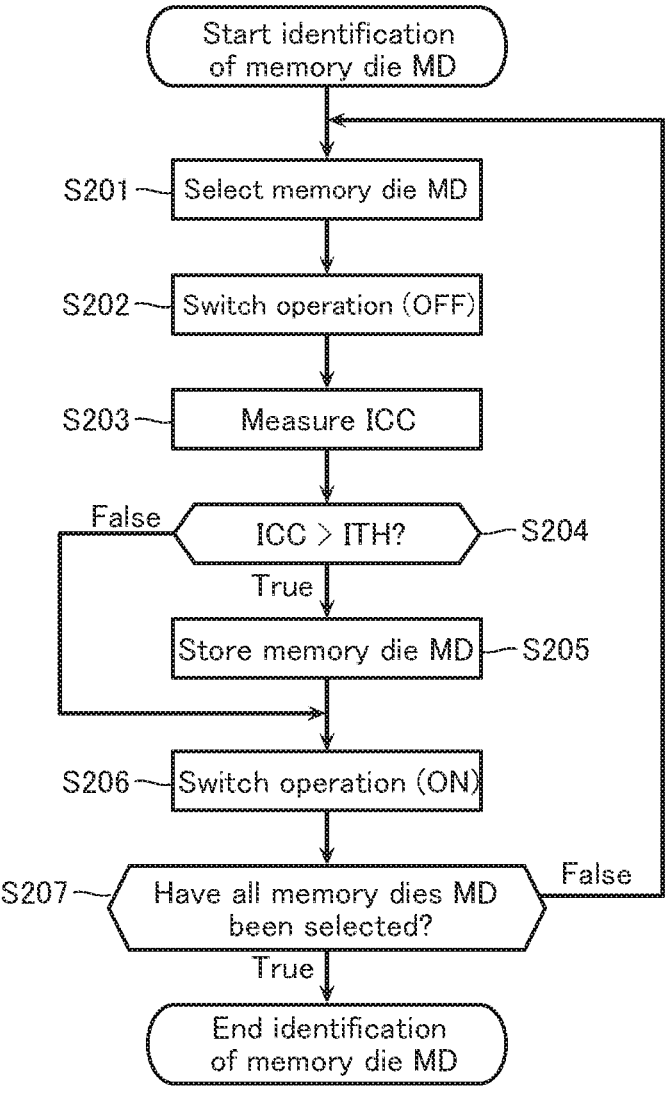
FIG. 10 is a schematic flowchart for describing another identification method of a memory die MD having a large standby current.

FIG. 10 is a schematic flowchart for describing another identification method of a memory die MD having a large standby current. In the method exemplified in FIG. 10, the memory die MD having a large standby current is identified by electrically conducting the four memory dies MD0 to MD3 in sequence with the power supply wiring $W_{VCC}$ and monitoring the current ICC.

Note that, in the following description, an example of the current ICC corresponding to the power supply voltage VCC will be described. However, a similar method can be employed to a current corresponding to the power supply voltage VCCQ.

In step S201, any one of the memory dies MD0 to MD3 are selected.

In step S202, the switch operation described with reference to FIG. 6 and FIG. 7 is executed, and all the memory dies MD other than the memory die MD selected in step S201 are electrically separated from the power supply wiring $W_{VCC}$.

In step S203, the current ICC is measured. The current ICC is a standby current flowing through the power supply wiring $W_{VCC}$.

In step S204, it is determined whether the current ICC is larger than the threshold current ITH or not. When it is larger, the process proceeds to step S205. When it is not larger, the process proceeds to step S206.

In step S205, information identifying the memory die MD selected in step S201 is stored, and the process proceeds to step S206.

In step S206, the switch operation described with reference to FIG. 6 and FIG. 8 is executed, and the memory dies MD other than the memory die MD selected in step S201 are electrically conducted with the power supply wiring $W_{VCC}$.

In step S207, it is determined whether the four memory dies MD0 to MD3 are all selected or not. When they are all selected, the process is terminated. When none of them is selected, the process returns to step S201.

Note that, in the semiconductor memory device according to the first embodiment, the signals described with reference to FIG. 6 is output from any of the four memory dies MD to drive the switch control circuit PC. Accordingly, if the four memory dies MD are all electrically separated from the power supply wiring $W_{VCC}$, the switch operation cannot be executed. For such reason, in the example of FIG. 10, after the current ICC is measured in step S203, the memory dies MD other than the one as the measurement target are once electrically conducted with the power supply wiring $W_{VCC}$ in step S206. However, in such method, it is necessary to execute the switch operation three times each in step S202 and step S206 in some cases.

Therefore, for example, a step (hereinafter referred to as an "additional step") of electrically conducting the memory die MD as the switch operation target with the power supply wiring $W_{VCC}$ can be added between step S201 and step S202, and omit step S206. In such case, the process starts in a state where the four memory dies MD are all electrically conducted with the power supply wiring $W_{VCC}$. At the first time of the additional step, the switch operation is not executed, and at the first time of step S202, the switch operation is executed three times. At the second to fourth time of the additional step and step S202, the switch operation is executed one time in each of the steps. With such method, the number of executions of the switch operations can be reduced to ensure speeding up the process.

[Test Method]

Figure 11:
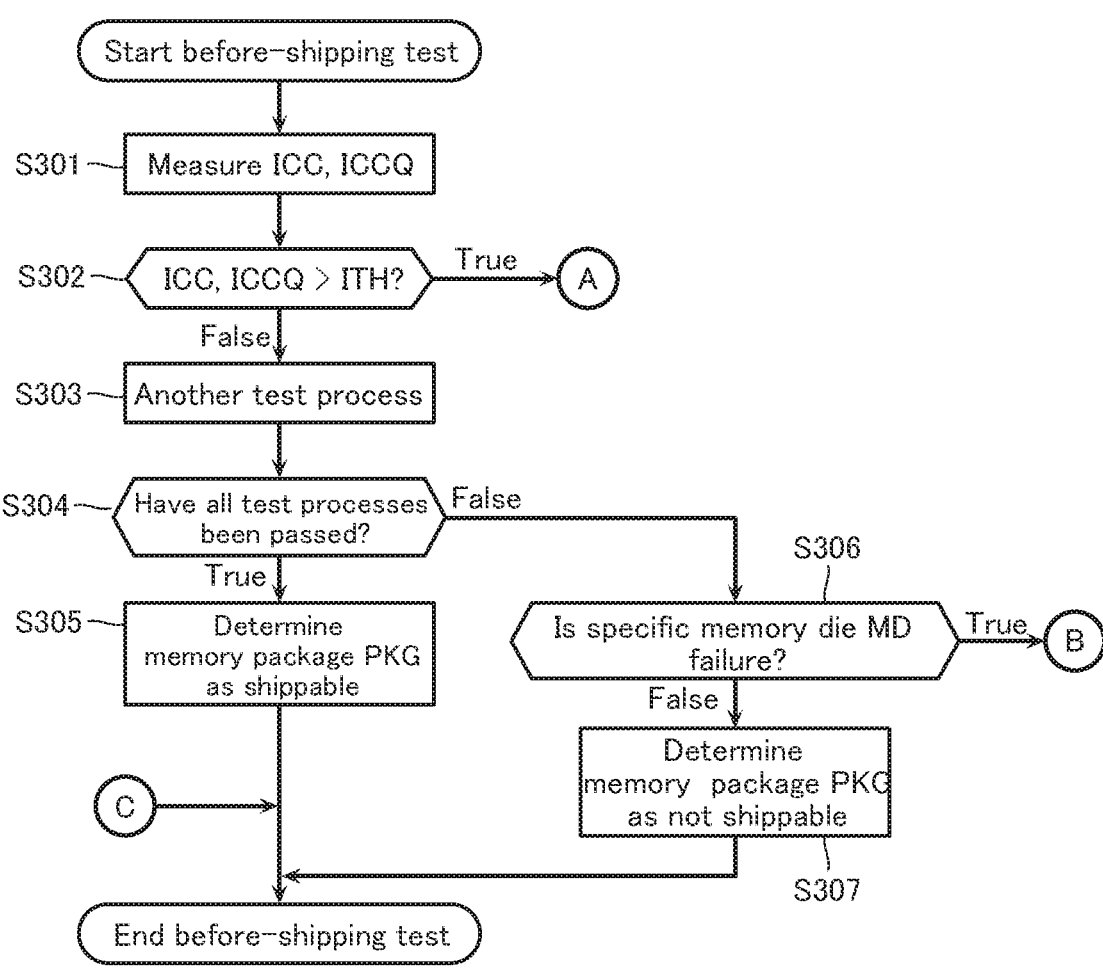
FIG. 11 is a schematic flowchart for describing a test method performed before shipping in a manufacturing process of the memory package PKG.
Figure 12:
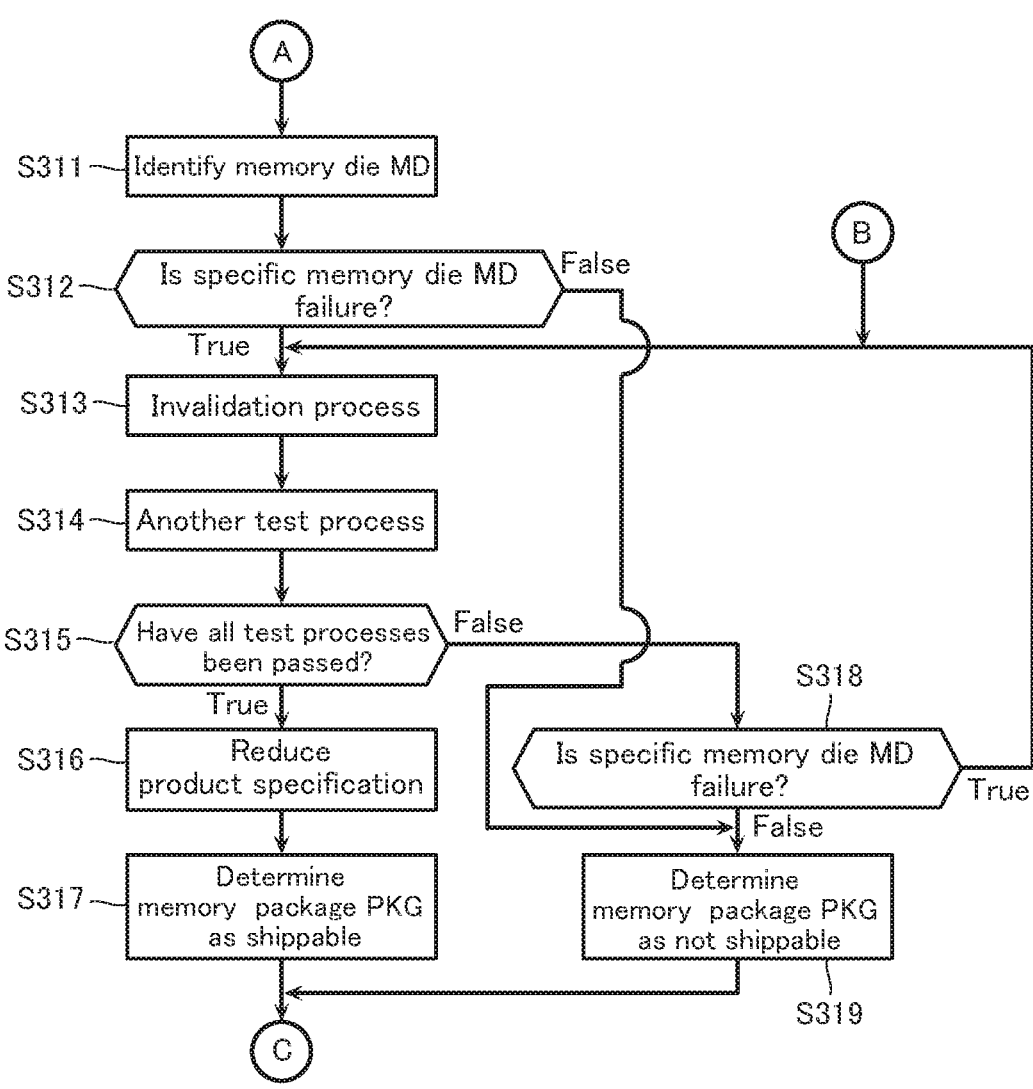
FIG. 12 is a schematic flowchart for describing the test method.

FIG. 11 and FIG. 12 are schematic flowcharts for describing a method of the test performed before shipping in the manufacturing process of the memory package PKG.

In step S301, the current ICC of the power supply wiring $W_{VCC}$ corresponding to the power supply voltage VCC, and the current ICCQ of the power supply wiring corresponding to the power supply voltage VCCQ are measured.

In step S302, it is determined whether the threshold current ITH is larger than at least one of the currents ICC, ICCQ or not. When it is larger, the process proceeds to step S311 (FIG. 12). When it is not larger, the process proceeds to step S303.

In step S303, another test process is executed.

In step S304, it is determined whether all the test processes including the other test process have been passed or not. When all of them have been passed, the process proceeds to step S305. When not all of them have been passed, the process proceeds to step S306.

In step S305, the memory package PKG is determined to be shippable, and the test is terminated.

In step S306, it is determined whether the reason that the test process has not been passed exists in a specific memory die MD or not. When the reason exists in a specific memory die MD, the process proceeds to step S313 (FIG. 12). When the reason does not exist in a specific memory die MD, the process proceeds to step S307.

In step S307, the memory package PKG is determined not to be shippable, and the test is terminated.

In step S311 (FIG. 12), the memory die MD having a large standby current is identified. In this process, for example, the method described with reference to FIG. 9 or the method described with reference to FIG. 10 is executed.

In step S312, it is determined whether the memory die MD having a large standby current is only a specific memory die MD or not. When the memory die MD having a large standby current is only a specific memory die MD (that is, when there exists memory dies MD having small standby currents), the process proceeds to step S313. When the memory die MD having a large standby current is not only a specific memory die MD (that is, when a memory die MD having a small standby current does not exist), the process proceeds to step S319.

In step S313, an invalidation process is performed to invalidate the specific memory die MD. In step S313, for example, the fuse element fs described with reference to FIG. 5 may be cut, or information identifying the invalidated memory die MD may be stored in any of the configurations in the memory system 10.

The memory die MD invalidated in step S313 includes, for example, the memory die MD whose information has been stored in step S105 of FIG. 9, the memory die MD whose information has been stored in step S205 of FIG. 10, the memory die MD that caused failure in step S306 of FIG. 11, and the memory die MD that caused failure in step S318 of FIG. 12.

In step S314, another test process is executed.

In step S315, it is determined whether all the test processes including the other test process have been passed or not. When all of them have been passed, the process proceeds to step S316. When not all of them have been passed, the process proceeds to step S318.

In step S316, a product specification of the memory package PKG is reduced. For example, when two memory dies MD among the four memory dies MD included in the memory package PKG are invalidated, the memory package PKG is classified as a product including two memory dies MD. Furthermore, for example, when three memory dies MD among the four memory dies MD included in the memory package PKG are invalidated, the memory package PKG is classified as a product including one memory die MD.

Note that, while the first embodiment exemplifies the memory package PKG including four memory dies MD, as described above, the number of the memory dies MD included in the memory package PKG is appropriately adjustable. Furthermore, the classification method in step S316 is appropriately adjustable according to the number of invalidated memory dies or the number of not-invalidated memory dies among the plurality of memory dies included in the memory package.

In step S316, for example, classification information may be printed on the memory package PKG, or data of the classification information may be stored in the memory package PKG.

In step S317, the memory package PKG is determined to be shippable, and the test is terminated.

In step S318, it is determined whether the reason that the test process has not been passed exists in a specific memory die MD or not. When the reason exists in a specific memory die MD, the process returns to step S313. When the reason does not exist in a specific memory die MD, the process proceeds to step S319.

In step S319, the memory package PKG is determined not to be shippable, and the test is terminated.

Effect of First Embodiment

With the semiconductor memory device according to the first embodiment, a memory die MD having a large standby current can be easily identified among the four memory dies MD0 to MD3 included in the memory package PKG and also be invalidated. Accordingly, such memory package PKG can be used as, for example, a memory package including two memory dies MD and the like.

In addition, with the semiconductor memory device according to the first embodiment, since a memory die MD having a large standby current can be easily identified among the four memory dies MD0 to MD3 included in the memory package PKG, efficiency of the failure analysis can be increased.

Furthermore, with the semiconductor memory device according to the first embodiment, since the standby current can be turned OFF in units of the memory dies MD, the standby current of the memory package PKG as a whole can be reduced.

Second Embodiment

The memory package PKG described with reference to FIG. 1 does not include the controller die CD. However, as described above, the memory package PKG may include the controller die CD. Hereinafter, such example will be described.

Figure 13:
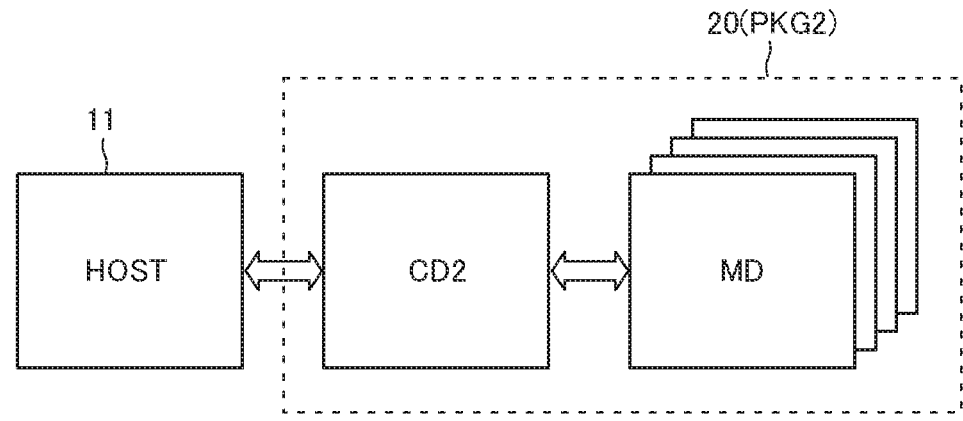
FIG. 13 is a schematic block diagram illustrating a configuration of a memory system 20 according to a second embodiment.

FIG. 13 is a schematic block diagram illustrating a configuration of a memory system 20 according to a second embodiment.

The memory system 20 is basically configured similarly to the memory system 10 according to the first embodiment. However, the memory system 20 includes a memory package PKG2 instead of the memory package PKG and the controller die CD.

The memory package PKG2 is basically configured similarly to the memory package PKG according to the first embodiment. However, the memory package PKG2 includes a controller die CD2. The controller die CD2 is configured similarly to the controller die CD.

Figure 14:
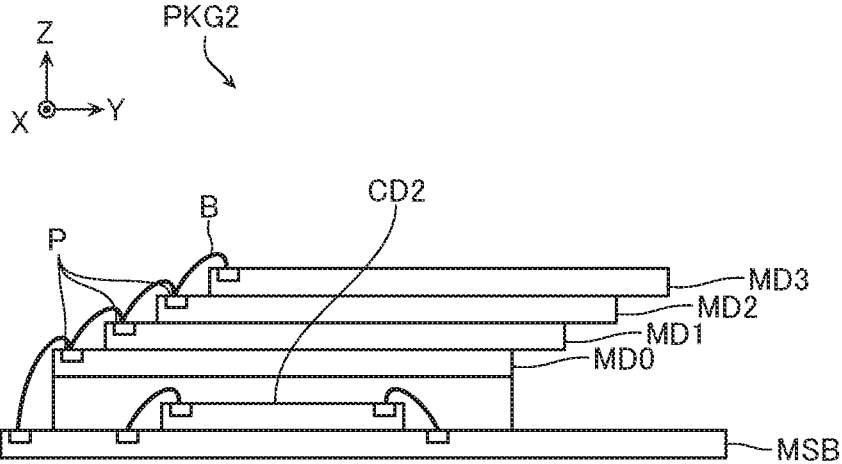
FIG. 14 is a schematic side view illustrating an exemplary configuration of a memory package PKG2 according to the second embodiment.
Figure 15:
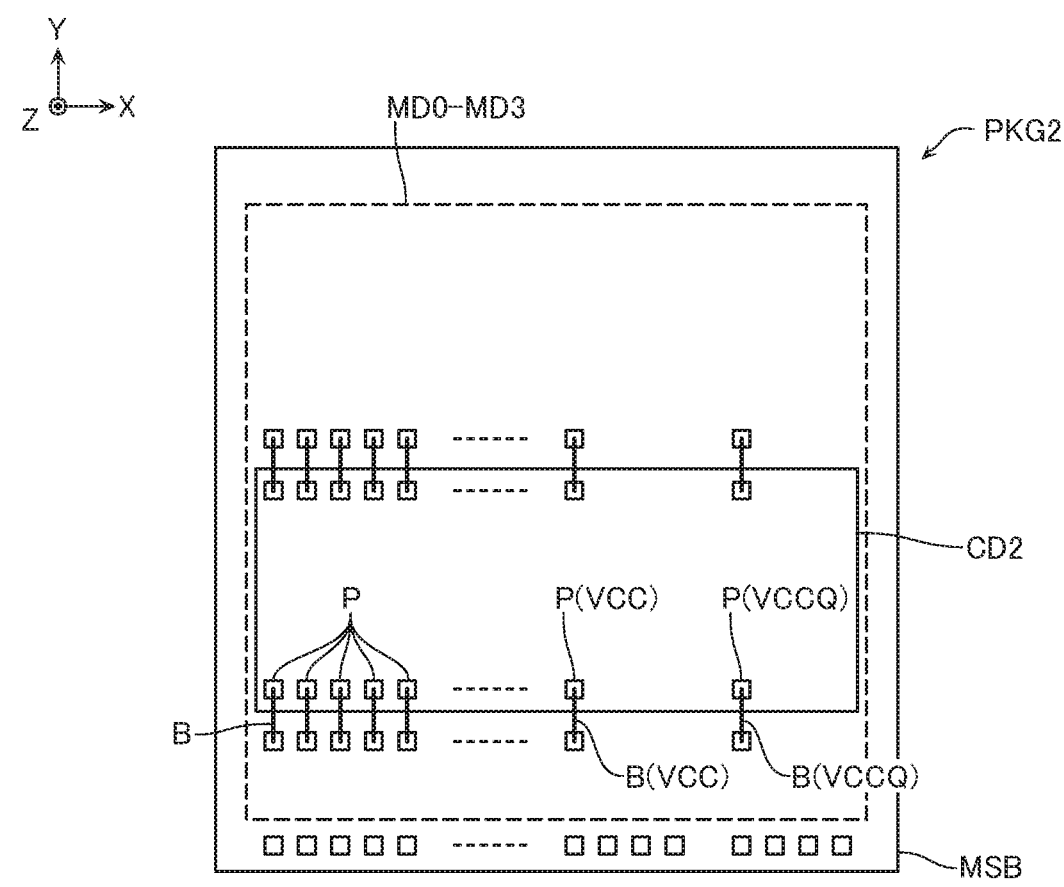
FIG. 15 is a schematic plan view illustrating the exemplary configuration.

FIG. 14 is a schematic side view illustrating an exemplary configuration of the memory package PKG2 according to the embodiment. FIG. 15 is a schematic plan view illustrating the exemplary configuration. For convenience of description, FIG. 14 and FIG. 15 omit parts of the configuration. For example, the memory dies MD0 to MD3 are not illustrated in FIG. 15. In FIG. 15, a region overlapping with the memory dies MD0 to MD3 when viewed from the Z-direction is indicated by dotted lines.

As illustrated in FIG. 14, in the memory package PKG2 according to the second embodiment, the controller die CD2 is stacked in the Z-direction together with the four memory dies MD on the mounting substrate MSB. The controller die CD2 is disposed between the mounting substrate MSB and the four memory dies MD.

As illustrated in FIG. 15, the controller die CD2 includes a plurality of bonding pad electrodes P arranged in the X-direction. The plurality of bonding pad electrodes P disposed on the controller die CD2 are each connected to a bonding wire B. Note that FIG. 15 illustrates an example in which power supply voltages VCC, VCCQ are applied to the controller die CD2. However, one or both of the power supply voltages VCC, VCCQ need not be applied to the controller die CD2. Furthermore, a power supply voltage different from the power supply voltages VCC, VCCQ may be applied to the controller die CD2.

The semiconductor memory device according to the second embodiment includes the configuration described with reference to FIG. 5 similarly to the semiconductor memory device according to the first embodiment. Furthermore, the semiconductor memory device according to the second embodiment can execute operations as described with reference to FIG. 6 to FIG. 10 similarly to the semiconductor memory device according to the first embodiment. That is, the configuration and operations as described in the first embodiment are applicable to the memory system 10 as described with reference to FIG. 1, and also to the memory system 20 as described with reference to FIG. 13.

Third Embodiment

Figure 16:
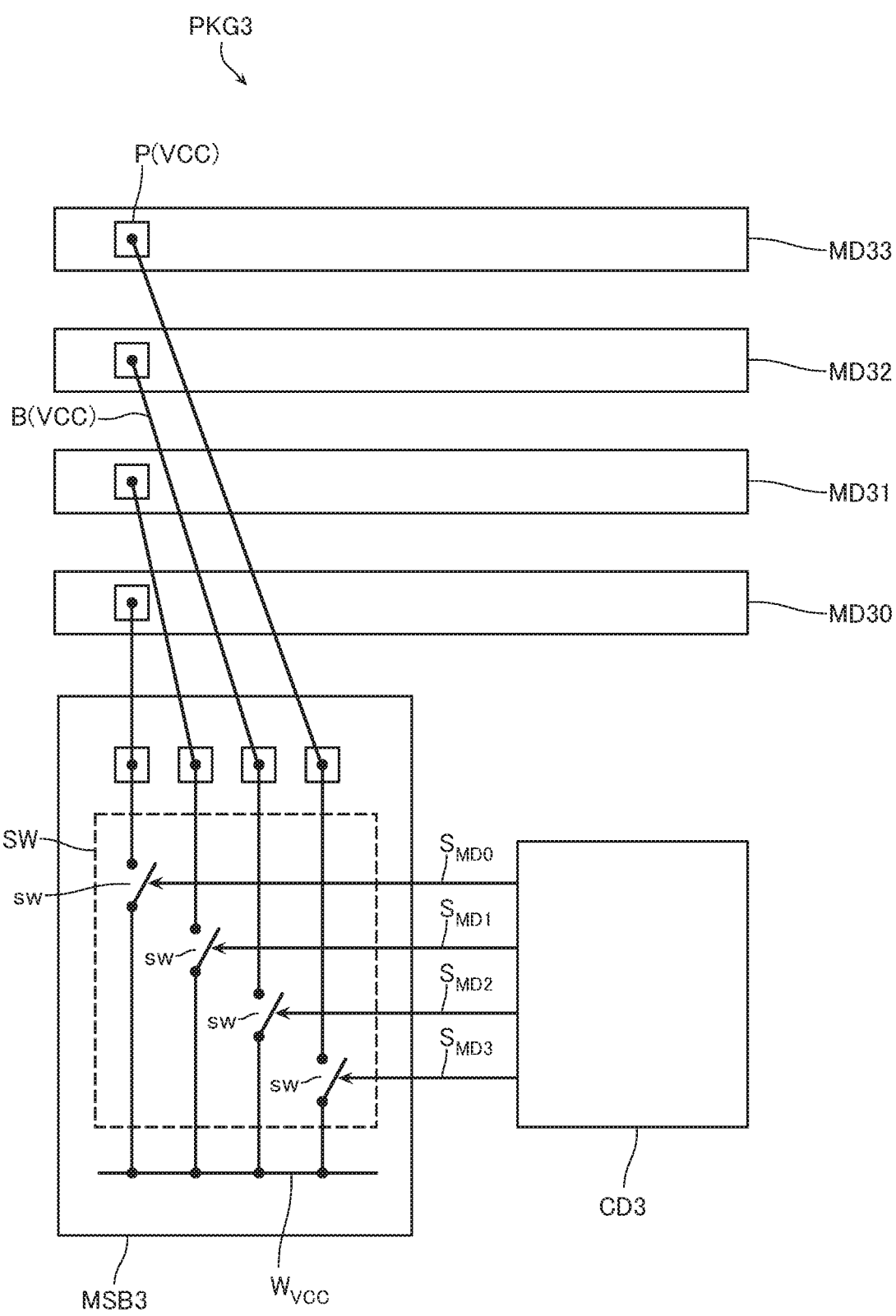
FIG. 16 is a schematic block diagram illustrating a part of a configuration of a memory package PKG3 according to a third embodiment.

FIG. 16 is a schematic block diagram illustrating a part of a configuration of a memory package PKG3 according to the third embodiment.

The memory package PKG3 according to the third embodiment is basically configured similarly to the memory package PKG2 according to the second embodiment. However, the memory package PKG3 includes a mounting substrate MSB3, four memory dies MD30 to MD33, and a controller die CD3 instead of the mounting substrate MSB, the four memory dies MD0 to MD3, or the controller die CD2.

The mounting substrate MSB3 is basically configured similarly to the mounting substrate MSB. However, the switch control circuit PC described with reference to FIG. 5 is not disposed on the mounting substrate MSB3.

The four memory dies MD30 to MD33 are basically configured similarly to the four memory dies MD0 to MD3. However, the bonding pad electrodes P(PC_ADD), P(/PC_EN_VCC) as described with reference to FIG. 5 are not disposed on the four memory dies MD30 to MD33.

The controller die CD3 is basically configured similarly to the controller die CD2. However, the controller die CD3 outputs control signals $S_{MD0}$ to $S_{MD3}$ to the switch circuit SW.

In the semiconductor memory device according to the third embodiment, the controller die CD3 drives the switch circuit SW. Accordingly, the switch operation can be executed even when the four memory dies MD are all electrically separated from the power supply wiring $W_{VCC}$. Therefore, when the operations as described with reference to FIG. 10 are executed in the semiconductor memory device according to the third embodiment, it is possible to, for example, electrically separate all the four memory dies MD30 to MD33 from the power supply wiring $W_{VCC}$ in advance, execute a step of electrically conducting one selected memory die MD with the power supply wiring $W_{VCC}$ instead of step S202, and execute a step of electrically separating the one selected memory die MD from the power supply wiring $W_{VCC}$ instead of step S206.

Fourth Embodiment

As described with reference to FIG. 4, in the semiconductor memory device according to the first embodiment, the bonding wires B(VCC), B(VCCQ) are each connected to one memory die MD. With such configuration, it is possible to electrically conduct the memory dies MD one by one with the power supply wiring $W_{VCC}$, or electrically separate the memory dies MD one by one from the power supply wiring $W_{VCC}$.

However, in such configuration, it is necessary to dispose a plurality of the bonding pad electrodes P(VCC), P(VCCQ) and the switch elements sw on the mounting substrate MSB. Therefore, the larger the number of the memory dies MD in the memory package PKG is, the more the areas of the bonding pad electrodes P(VCC), P(VCCQ) and the switch elements sw on the mounting substrate MSB may possibly increase.

Therefore, in a fourth embodiment, a plurality of the memory dies MD in the memory package are grouped into two or more groups, and the memory dies MD in a same group are connected to common bonding wires B(VCC), B(VCCQ). With such configuration, the number of the bonding pad electrodes P(VCC), P(VCCQ) and the number of the switch elements sw on the mounting substrate MSB can be reduced.

Figure 17:
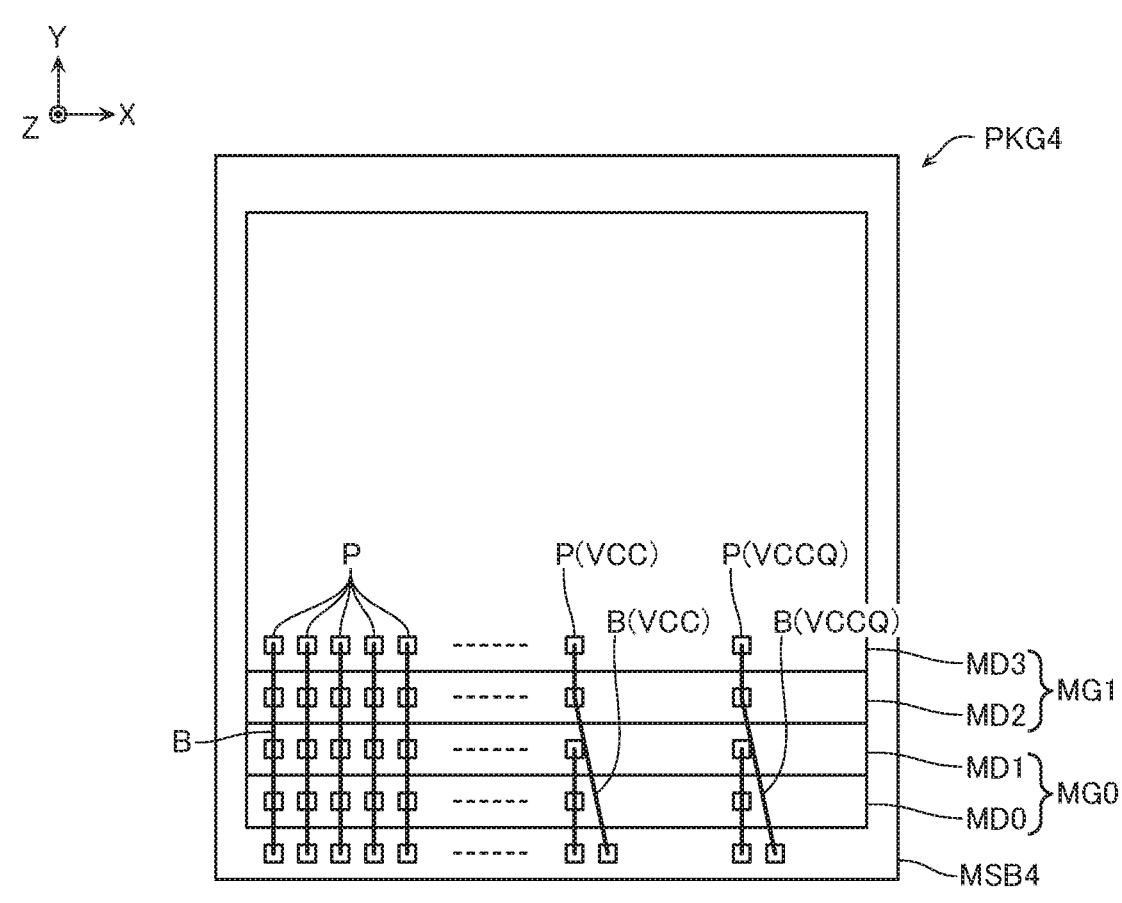
FIG. 17 is a schematic plan view illustrating an exemplary configuration of a memory package PKG4 according to a fourth embodiment.

FIG. 17 is a schematic plan view illustrating an exemplary configuration of a memory package PKG4 according to the embodiment. For convenience of description, FIG. 17 omits parts of the configuration.

The memory package PKG4 is basically configured similarly to the memory package PKG.

However, the memory package PKG4 includes a mounting substrate MSB4 instead of the mounting substrate MSB. The mounting substrate MSB4 is basically configured similarly to the mounting substrate MSB.

In addition, in the illustrated example, the two memory dies MD0, MD1 among the four memory dies MD0 to MD3 are grouped into a memory group MG0. The two memory dies MD2, MD3 are grouped into a memory group MG1.

In the illustrated example, two bonding pad electrodes P(VCC) arranged in the X-direction when viewed from the Z-direction are disposed on the mounting substrate MSB4 corresponding to the bonding pad electrodes P(VCC) of the four memory dies MD0 to MD3. In the illustrated example, corresponding to the two bonding pad electrodes P(VCC), two bonding wires B(VCC) are also disposed. The respective bonding wires B(VCC) are connected to three bonding pad electrodes P in total including one bonding pad electrode P(VCC) disposed on the mounting substrate MSB4 and two bonding pad electrodes P(VCC) corresponding to one of the memory group MG0 and the memory group MG1, and the respective bonding wires B(VCC) are not connected to the two memory dies MD included in the other of the memory group MG0 and the memory group MG1.

In the illustrated example, two bonding pad electrodes P(VCCQ) arranged in the X-direction when viewed from the Z-direction are disposed on the mounting substrate MSB4 corresponding to the bonding pad electrodes P(VCCQ) of the four memory dies MD0 to MD3. In the illustrated example, corresponding to the two bonding pad electrodes P(VCCQ), two bonding wires B(VCCQ) are also disposed. The respective bonding wires B(VCCQ) are connected to three bonding pad electrodes P in total including one bonding pad electrode P(VCCQ) disposed on the mounting substrate MSB4, and two bonding pad electrodes P(VCCQ) corresponding to one of the memory group MG0 and the memory group MG1, and the respective bonding wires B(VCCQ) are not connected to the two memory dies MD included in the other of the memory group MG0 and the memory group MG1.

Figure 18:
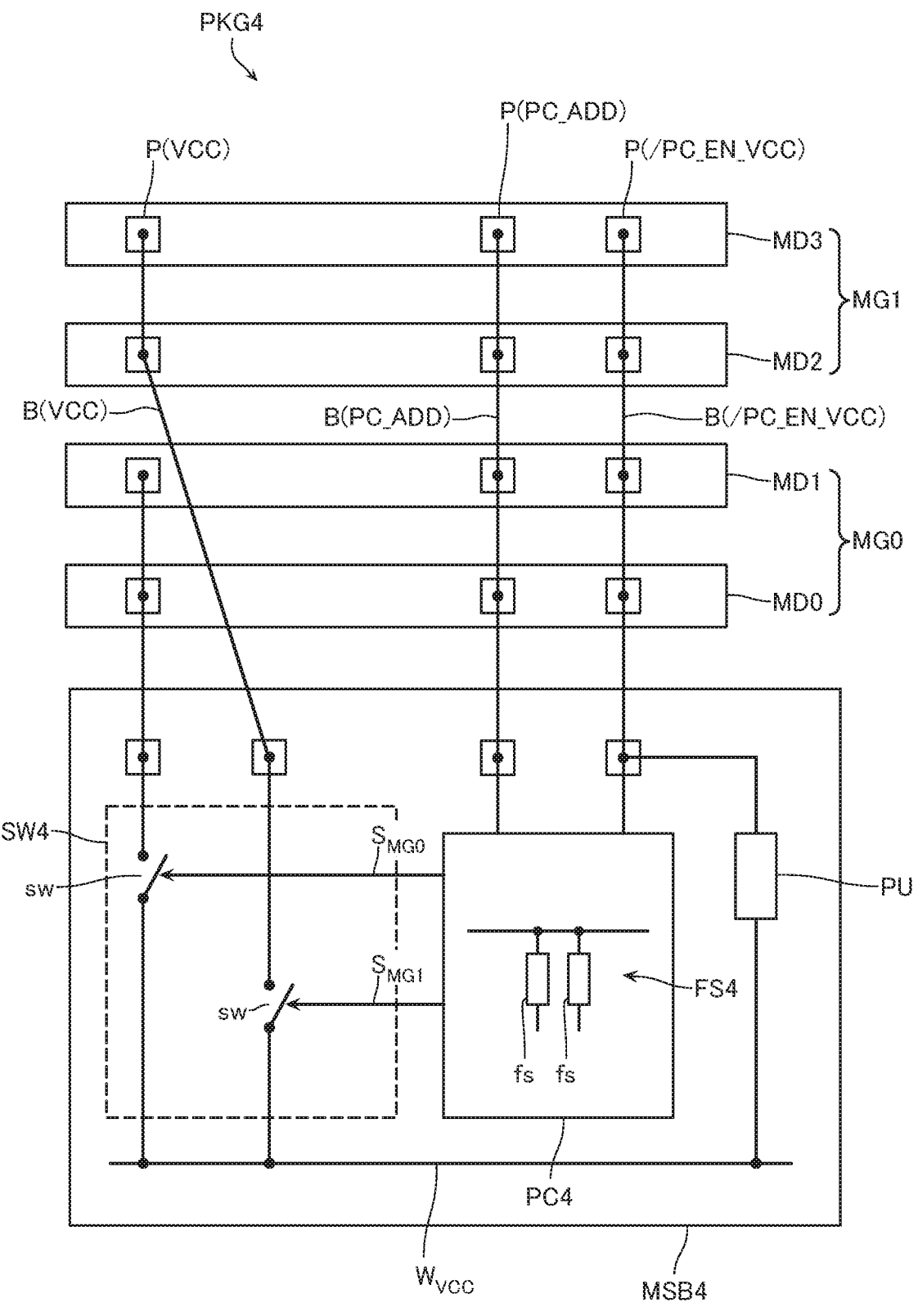
FIG. 18 is a schematic block diagram illustrating a part of the configuration of the memory package PKG4.

FIG. 18 is a schematic block diagram illustrating a part of the configuration of the memory package PKG4 according to the embodiment.

As illustrated in FIG. 18, a switch circuit SW4, a switch control circuit PC4, and a fuse circuit FS4 are disposed instead of the switch circuit SW, the switch control circuit PC or the fuse circuit FS on the mounting substrate MSB4.

The switch circuit SW4 includes two switch elements sw disposed corresponding to the two bonding wires B(VCC). These two switch elements sw are configured to be controllable independently from one another.

The switch control circuit PC4 is basically configured similarly to the switch control circuit PC.

However, the switch control circuit PC4 outputs control signals $S_{MG0}$, $S_{MG1}$ to the switch circuit SW4. The switch control circuit PC4 controls the control signals $S_{MG0}$, $S_{MG1}$ to be in the "H" state or the "L" state according to an operation from outside.

The switch control circuit PC4 may include the fuse circuit FS4. The illustrated fuse circuit FS4 includes two fuse elements fs corresponding to the two bonding wires B(VCC).

Note that, FIG. 18 has exemplified the switch circuit SW4 corresponding to the power supply voltage VCC. However, a configuration similar to the switch circuit SW4 may be disposed corresponding to the power supply voltage VCCQ. In this case, one switch control circuit PC4 corresponding to the power supply voltages VCC, VCCQ may be disposed on the mounting substrate MSB4 and thereby control the two switch circuits SW4 corresponding to the power supply voltages VCC, VCCQ. In addition, two switch control circuits PC4 may be disposed corresponding to the power supply voltages VCC, VCCQ on the mounting substrate MSB4.

Note that, the memory package PKG4 according to the fourth embodiment may include the controller die CD2 similarly to the memory package PKG2 (FIG. 13 to FIG. 15) according to the second embodiment.

The memory package PKG4 according to the fourth embodiment may include the memory dies MD30 to MD33 and the controller die CD3 instead of the memory dies MD0 to MD3 similarly to the memory package PKG3 (FIG. 16) according to the third embodiment. The switch control circuit PC4 may be omitted and the switch circuit SW4 may be controlled by the controller die CD3.

In the example of FIG. 18, the bonding wires B(PC_ADD), B(/PC_EN_VCC) are connected to all of the four memory dies MD0 to MD3. However, the bonding wires B(PC_ADD), B(/PC_EN_VCC) need only be connected to any one of the memory dies MD included in the memory group MG0 and any one of the memory dies MD included in the memory group MG1.

In addition, in the memory package PKG4 according to the fourth embodiment, when the switch operation described with reference to FIG. 6 to FIG. 8, the method described with reference to FIG. 9 or FIG. 10, or the test method described with reference to FIG. 11 and FIG. 12 is executed, the operations executed in units of the memory dies MD in the first embodiment are executed in units of the memory groups.

For example, when the switch operation described with reference to FIG. 6 is executed, the electrical separation from the power supply wiring $W_{VCC}$ and the electrical conduction with the power supply wiring $W_{VCC}$ are executed in units of the memory groups instead of in units of the memory dies MD.

When a command set as described with reference to FIG. 7 or FIG. 8 is input from the controller die CD to the memory package PKG4 at the execution of the switch operation, the address signals A1, A2 included in this command set may be chip addresses as described above, or other information specifying memory groups.

When the method described with reference to FIG. 9 or FIG. 10 is executed, the measurement of the standby current in step S103 or step S203 is executed in units of the memory groups instead of in units of the memory dies MD. For example, a current flowing through the power supply wiring $W_{VCC}$ is measured in a state where the power supply voltage VCC is applied to a part of the memory dies MD0, MD1 and the power supply voltage VCC is not applied to the other memory dies MD2, MD3.

When the test method described with reference to FIG. 11 and FIG. 12 is executed, the invalidation process in step S313 (FIG. 12) is executed in units of the memory groups instead of in units of the memory dies MD.

Fifth Embodiment

As described above, the number of the memory dies MD stacked on the mounting substrate may be more or less than four. Hereinafter, an example in which eight memory dies MD are stacked on the mounting substrate will be described.

Figure 19:
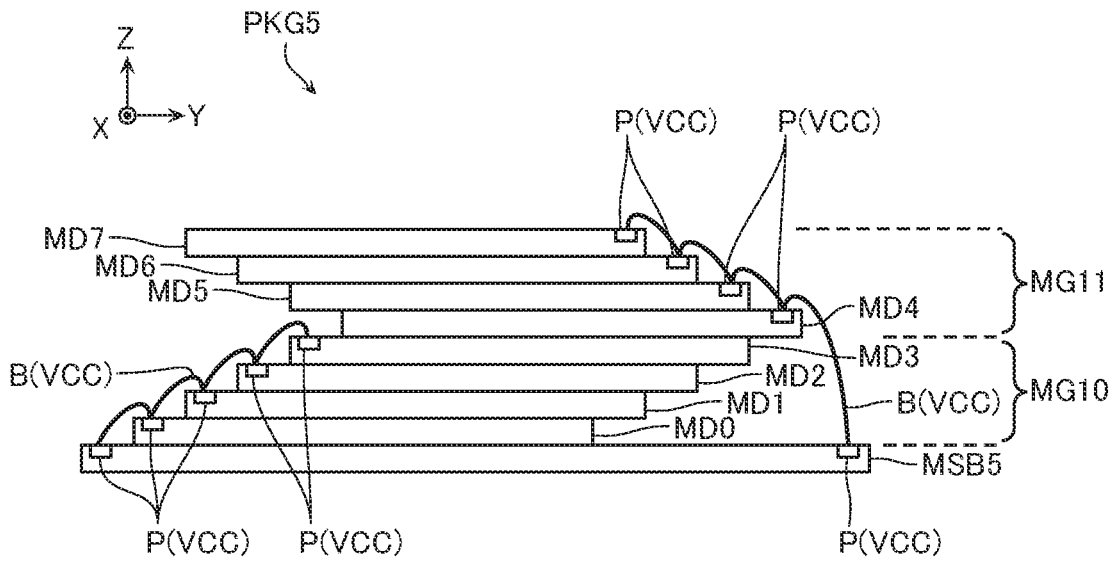
FIG. 19 is a schematic side view illustrating an exemplary configuration of a memory package PKG5 according to a fifth embodiment.
Figure 20:
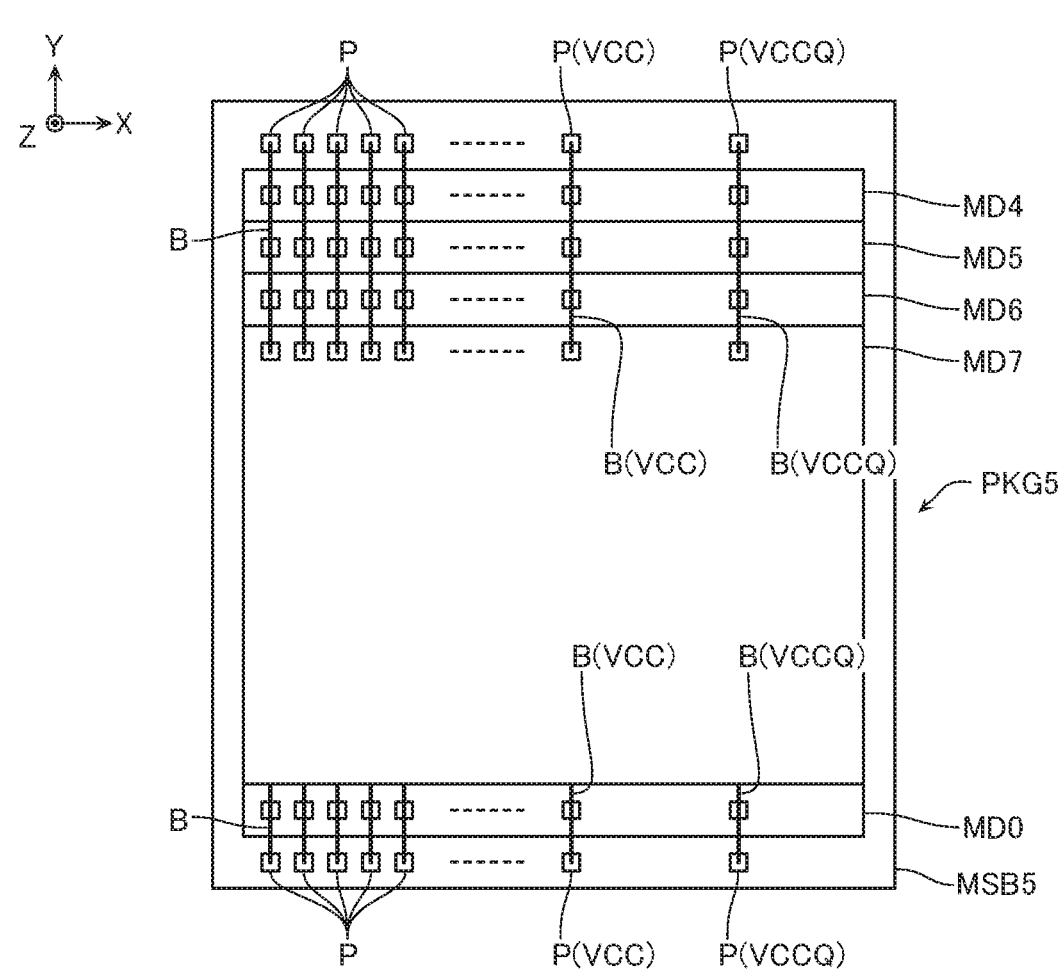
FIG. 20 is a schematic plan view illustrating the exemplary configuration.

FIG. 19 is a schematic side view illustrating an exemplary configuration of a memory package PKG5 according to a fifth embodiment. FIG. 20 is a schematic plan view illustrating the exemplary configuration. For sake of convenience, FIG. 19 and FIG. 20 omit parts of the configuration.

As illustrated in FIG. 19, the memory package PKG5 according to the fifth embodiment includes a mounting substrate MSB5 and eight memory dies MD stacked in the Z-direction on the mounting substrate MSB5. Note that, in the illustrated example, memory dies MD0 to MD7 are exemplified as the eight memory dies MD. In the illustrated example, the memory dies MD0 to MD3 are grouped into a memory group MG10. The memory dies MD4 to MD7 are grouped into a memory group MG11.

Bonding pad electrodes P are disposed in regions of end portions in a Y-direction positive side and negative side of an upper surface of the mounting substrate MSB5. FIG. 19 exemplifies the bonding pad electrodes P(VCC) as the bonding pad electrodes P. A region overlapping with the memory die MD0 when viewed from the Z-direction of the upper surface of the mounting substrate MSB5 is bonded to a lower surface of the memory die MD0 via adhesives or the like.

Bonding pad electrodes P are disposed in regions of end portions in the Y-direction negative side of upper surfaces of the memory dies MD0 to MD3. Regions other than those of the end portions in the Y-direction negative side of the upper surfaces of the memory dies MD0 to MD3 are bonded to respective lower surfaces of the other memory dies MD1 to MD4 via adhesives or the like. Furthermore, in the illustrated example, five bonding pad electrodes P(VCC) corresponding to the mounting substrate MSB5 and the memory dies MD0 to MD3 are connected to a common bonding wire B(VCC).

Bonding pad electrodes P are disposed in regions of end portions in the Y-direction positive side of upper surfaces of the memory dies MD4 to MD7. Regions other than those of the end portions in the Y-direction positive side of the upper surfaces of the memory dies MD4 to MD6 are bonded to respective lower surfaces of the other memory dies MD5 to MD7 via adhesives or the like. Furthermore, in the illustrated example, five bonding pad electrodes P(VCC) corresponding to the mounting substrate MSB5, and the memory dies MD4 to MD7 are connected to a common bonding wire B(VCC).

In the example of FIG. 20, the bonding pad electrodes P(VCC), P(VCCQ) are disposed in each of regions in the Y-direction positive side and negative side with respect to the memory dies MD0 to MD7 on the mounting substrate MSB5. In the illustrated example, corresponding to the bonding pad electrodes P(VCC), P(VCCQ), two bonding wires B(VCC) and two bonding wires B(VCCQ) are also disposed. These bonding wires B(VCC), B(VCCQ) extend in the Y-direction when viewed from the Z-direction.

Here, as described with reference to FIG. 4, in the semiconductor memory device according to the first embodiment, a part of the bonding wires B extend in diagonal directions when viewed from the Z-direction. On the other hand, such bonding wire B is not included in the semiconductor memory device according to the fifth embodiment. Such configuration is easily manufacturable compared with the configuration including the bonding wires B extending in the diagonal directions when viewed from the Z-direction.

Figure 21:
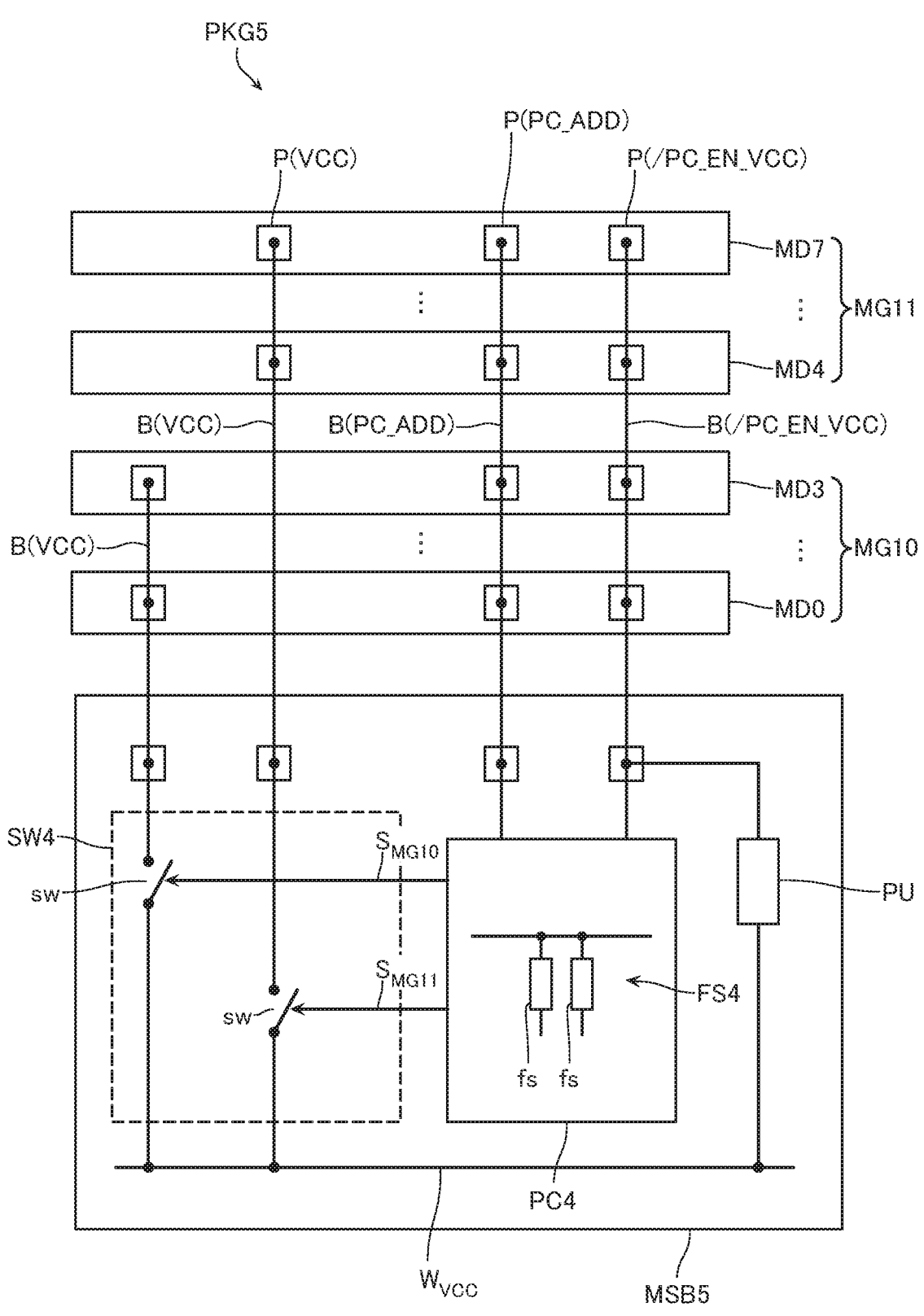
FIG. 21 is a schematic block diagram illustrating a part of the configuration of the memory package PKG5.

FIG. 21 is a schematic block diagram illustrating a part of the configuration of the memory package PKG5 according to the embodiment. As illustrated in FIG. 21, the mounting substrate MSB5 is configured similarly to the mounting substrate MSB4. However, the switch control circuit PC4 disposed on the mounting substrate MSB5 outputs control signals $S_{MG10}$, $S_{MG11}$ to the switch circuit SW4.

The memory package PKG5 according to the fifth embodiment may include the controller die CD2 similarly to the memory package PKG2 (FIG. 13 to FIG. 15) according to the second embodiment.

The memory package PKG5 according to the fifth embodiment may include the memory dies MD30 to MD33 and the controller die CD3 instead of the memory dies MD0 to MD3 similarly to the memory package PKG3 (FIG. 16) according to the third embodiment. In addition, the switch control circuit PC4 may be omitted and the switch circuit SW4 may be controlled by the controller die CD3.

In the example of FIG. 21, the bonding wires B(PC_ADD), B(/PC_EN_VCC) are connected to all the eight memory dies MD0 to MD7. However, the bonding wires B(PC_ADD), B(/PC_EN_VCC) need only be connected to any one of the memory dies MD included in the memory group MG10 and any one of the memory dies MD included in the memory group MG11.

In the memory package PKG5 according to the fifth embodiment, when the switch operation described with reference to FIG. 6 to FIG. 8, the method described with reference to FIG. 9 or FIG. 10, or the test method described with reference to FIG. 11 and FIG. 12 is executed, the operations executed in units of the memory dies MD in the first embodiment are executed in units of the memory groups.

Other Embodiments

The semiconductor memory devices according to the first embodiment to the fifth embodiment have been described above. However, the semiconductor memory devices according to these embodiments are merely examples, and specific configurations, operations, and the like are appropriately adjustable.

For example, the configurations and manufacturing methods as described in the first embodiment to the fifth embodiment are applicable to a configuration without a mounting substrate.

[Others]

While certain embodiments have been described, these embodiments have been presented by way of example only, and are not intended to limit the scope of the inventions. Indeed, the novel methods and systems described herein may be embodied in a variety of other forms: furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
a substrate extending in a first direction and a second direction intersecting with the first direction, and including a first electrode and a second electrode arranged in the first direction;
a first memory die disposed above the substrate via first adhesives at a position at which the first memory die does not overlap the first electrode and the second electrode when viewed in a stacking direction intersecting with the first direction and the second direction, and including a third electrode;
a second memory die disposed above the first memory die via second adhesives at a position at which the second memory die does not overlap the first electrode, the second electrode, and the third electrode when viewed in the stacking direction, and including a fourth electrode provided at a position in the first direction identical to the position of the third electrode in the first direction;
a first bonding wire including one end connected to the first electrode and the other end connected to the third electrode, extending along a straight line passing through the one and the other ends when viewed in the stacking direction, and configured to apply a power supply voltage from the substrate to the first memory die;
a first switch element provided at the substrate and electrically connected to the first bonding wire;
a second bonding wire including one end connected to the second electrode and the other end connected to the fourth electrode, extending along a straight line passing through the one and the other ends when viewed in the stacking direction, and configured to apply the power supply voltage from the substrate to the second memory die;
a second switch element provided at the substrate and electrically connected to the second bonding wire; and
a wiring provided at the substrate electrically connected to the first bonding wire via the first switch element, and electrically connected to the second bonding wire via the second switch element, wherein
the straight line along which the first bonding wire extends when viewed in the stacking direction intersects with the straight line along which the second bonding wire extends when viewed in the stacking direction, and
the first switch element and the second switch element are independently controllable.

2. The semiconductor memory device according to claim 1, wherein the first bonding wire is not conducted to the second memory die electrically, and the second bonding wire is not conducted to the first memory die electrically.

3. The semiconductor memory device according to claim 1, further comprising a controller, wherein the controller is electrically connected to the first switch element and the second switch element.

4. A semiconductor memory device according to claim 3, comprising:
a substrate extending in a first direction and a second direction intersecting with the first direction, and including a first electrode and a second electrode arranged in the second direction;
a first memory die disposed above the substrate via first adhesives at a position between the first electrode and the second electrode when viewed in a stacking direction intersecting with the first direction and the second direction, and including a third electrode;
a second memory die disposed above the first memory die via second adhesives at a position at which the second memory die does not overlap the second electrode when viewed in the stacking direction, and including a fourth electrode;
a first bonding wire including one end connected to the first electrode and the other end connected to the third electrode, extending along a straight line passing through the one and the other ends when viewed in the stacking direction, and configured to apply a power supply voltage from the substrate to the first memory die;
a first switch element provided at the substrate and electrically connected to the first bonding wire;
a second bonding wire including one end connected to the second electrode and the other end connected to the fourth electrode, extending along a straight line passing through the one and the other ends when viewed in the stacking direction, and configured to apply the power supply voltage from the substrate to the second memory die;

a second switch element provided at the substrate and electrically connected to the second bonding wire; and a wiring provided at the substrate, electrically connected to the first bonding wire via the first switch element, and electrically connected to the second bonding wire via the second switch element, wherein the first switch element and the second switch element are independently controllable.

5. The semiconductor memory device according to claim 4, wherein the straight line along which the first bonding wire extends when viewed in the stacking direction corresponds to the straight line along which the second bonding wire extends when viewed in the stacking direction.

6. The semiconductor memory device according to claim 4, wherein the first bonding wire is not conducted to the second memory die, and the second bonding wire is not conducted to the first memory die.

7. A semiconductor memory device, comprising:

a first memory die;

a second memory die disposed above the first memory die via adhesives;

a first wiring connected to the first memory die, and configured to apply a power supply voltage to the first memory die;

a first switch element connected to the first wiring;

a second wiring connected to the second memory die, and configured to apply the power supply voltage to the second memory die;

a second switch element connected to the second wiring;

a third wiring electrically connected to the first wiring via the first switch element, and electrically connected to the second wiring via the second switch element;

a switch control circuit electrically connected to the first switch element and the second switch element;

a fourth wiring electrically connected to the first memory die, the second memory die and the switch control circuit; and a fifth wiring electrically connected to the first memory die, the second memory die and the switch control circuit, wherein the fourth wiring is disposed for transferring an enable signal that controls the switch control circuit, and the fifth wiring is disposed for transferring an address signal corresponding to the first memory die or the second memory die.

8. The semiconductor memory device according to claim 4, further comprising:

a controller, wherein the controller is electrically connected to the first switch element and the second switch element.

9. A semiconductor memory device, comprising:

a first memory die;

a second memory die disposed above the first memory die via adhesives;

a third memory die;

a fourth memory die disposed above the third memory die via adhesives; and a first wiring connected to the first memory die and the third memory die, and configured to apply a power supply voltage to the first memory die and the third memory die;

a first switch element connected to the first wiring;

a second wiring connected to the second memory die and the fourth memory die, and configured to apply the power supply voltage to the second memory die and the fourth memory die;

a second switch element connected to the second wiring; and a third wiring electrically connected to the first wiring via the first switch element, and electrically connected to the second wiring via the second switch element.

10. The semiconductor memory device according to claim 9, wherein the first wiring is not conducted to the fourth memory die electronically, and the second wiring is not conducted to the third memory die electrically.

11. A method of manufacturing a semiconductor memory device, comprising:

preparing the semiconductor memory device comprising:

a plurality of memory dies including a first memory die and a second memory die, and a wiring electrically connected to the first memory die and the second memory die;

measuring a first current flowing through the wiring in a state where the wiring is electrically conducted to the first memory die and the wiring is not electrically conducted to the second memory die;

measuring a second current flowing through the wiring in a state where the wiring is electrically conducted to the second memory die; and corresponding to the magnitude of the first current and the second current, invalidating at least one of the first memory die and the second memory die by electrically separating the at least one of the first memory die and the second memory die from the wiring.

12. The method of manufacturing the semiconductor memory device according to claim 11, further comprising invalidating the first memory die when the first current is larger than a threshold current.

13. The method of manufacturing the semiconductor memory device according to claim 11, further comprising measuring the second current flowing through the wiring in the state where the wiring is electrically conducted to the first memory die and the second memory die, and invalidating the first memory die when a difference between the second current and the first current is larger than a threshold current.

14. The method of manufacturing the semiconductor memory device according to claim 11, wherein the semiconductor memory device is classified corresponding to a number of memory dies that are to be electrically separated from the wiring or a number of memory dies that are not to be electrically separated from the wiring among the plurality of memory dies.

15. A semiconductor memory device, comprising:

a plurality of memory dies including a first memory die and a second memory die; and a wiring electrically connected to the plurality of memory dies, wherein the first memory die performs a first operation or a second operation when a first command set and a second command set are input, the first command set includes first address information corresponding to the first memory die, the second command set includes second address information corresponding to the second memory die, the first operation electrically conducts the second memory die to the wiring, and the second operation electrically separates the second memory die from the wiring.

* * * * *